United States Patent
Leduc

(10) Patent No.: US 10,921,484 B2
(45) Date of Patent: Feb. 16, 2021

(54) METHODS AND SYSTEMS FOR DETECTING MOTION CORRESPONDING TO A FIELD OF INTEREST

(71) Applicant: Reliance Core Consulting LLC, Alexandria, VA (US)

(72) Inventor: Jean-Pierre Leduc, Clarksburg, MD (US)

(73) Assignee: RELIANCE CORE CONSULTING, Alexandria, VA (US)

( * ) Notice: Subject to any disclaimer, the term of this patent is extended or adjusted under 35 U.S.C. 154(b) by 28 days.

(21) Appl. No.: 16/197,725

(22) Filed: Nov. 21, 2018

(65) Prior Publication Data
US 2019/0154871 A1    May 23, 2019

Related U.S. Application Data

(60) Provisional application No. 62/589,287, filed on Nov. 21, 2017.

(51) Int. Cl.
*G08B 13/196*    (2006.01)
*G08B 13/189*    (2006.01)
(Continued)

(52) U.S. Cl.
CPC .............. *G01V 8/20* (2013.01); *B62D 63/02* (2013.01); *B64C 39/024* (2013.01); *G06T 7/20* (2013.01); *G08B 13/189* (2013.01); *G08B 13/1895* (2013.01); *G08B 13/19* (2013.01); *G08B 13/196* (2013.01); *G08B 13/1966* (2013.01);
(Continued)

(58) Field of Classification Search
CPC ... G01V 8/20; G01V 8/10–8/26; B62D 63/02; B64C 39/024; B64C 2201/127; G06T 7/20; G06T 2207/10016; G08B 13/19602; G08B 13/1966; G08B 13/196; G08B 13/189; G08B 13/1895; G08B 13/19608; G08B 13/19632; G08B 21/12–16; H01L 27/14; H01L 27/1446; H04N 5/247; H04N 7/181; G01J 1/44; G01J 2001/448
See application file for complete search history.

(56) References Cited

U.S. PATENT DOCUMENTS

| 6,606,157 | B1 * | 8/2003 | Kaye ................... | G01N 15/1459 257/E31.039 |
| 7,362,911 | B1 * | 4/2008 | Frank ..................... | H04N 5/365 348/E5.081 |

(Continued)

*Primary Examiner* — Robert J Hance

(57) ABSTRACT

Disclosed is a system that performs motion analysis in a field of interest. The system may include at least one gateway disposable proximal to the field of interest. Further, the system may include a plurality of motion sensors. Further, a motion sensor may include a photodetector array, a processor and a wireless transmitter. Further, the wireless transmitter may be configured to transmit the digital information to at least one of a motion sensor of the plurality of motion sensors and the at least one gateway. Additionally, the system may include a plurality of video cameras disposable at a plurality of key locations in the field of interest. Further, at least one video camera may be further configured to transmit a part of a corresponding image sequence to at least one of the remote monitoring center through the at least one gateway.

19 Claims, 32 Drawing Sheets

(51) Int. Cl.

| | |
|---|---|
| *G08B 21/12* | (2006.01) |
| *G01V 8/20* | (2006.01) |
| *H01L 27/144* | (2006.01) |
| *H04N 7/18* | (2006.01) |
| *H01L 27/14* | (2006.01) |
| *G08B 21/14* | (2006.01) |
| *G08B 21/02* | (2006.01) |
| *G08B 13/19* | (2006.01) |
| *G08B 21/16* | (2006.01) |
| *B62D 63/02* | (2006.01) |
| *B64C 39/02* | (2006.01) |
| *G06T 7/20* | (2017.01) |
| *H04N 5/247* | (2006.01) |
| *G01J 1/44* | (2006.01) |

(52) U.S. Cl.
CPC . *G08B 13/19602* (2013.01); *G08B 13/19608* (2013.01); *G08B 13/19617* (2013.01); *G08B 13/19632* (2013.01); *G08B 13/19639* (2013.01); *G08B 21/0277* (2013.01); *G08B 21/12* (2013.01); *G08B 21/14* (2013.01); *G08B 21/16* (2013.01); *H01L 27/14* (2013.01); *H01L 27/1446* (2013.01); *H04N 5/247* (2013.01); *H04N 7/181* (2013.01); *B64C 2201/127* (2013.01); *G01J 1/44* (2013.01); *G01J 2001/448* (2013.01); *G06T 2207/10016* (2013.01)

(56) References Cited

U.S. PATENT DOCUMENTS

| | | | | |
|---|---|---|---|---|
| 9,454,820 | B1* | 9/2016 | Kirmani | G06K 9/4661 |
| 10,044,985 | B1* | 8/2018 | Parker | H04N 7/18 |
| 10,078,328 | B1* | 9/2018 | Slater | B64G 3/00 |
| 10,741,034 | B2* | 8/2020 | Berrada | C12Q 1/68 |
| 2003/0135971 | A1* | 7/2003 | Liberman | B01D 67/0041 |
| | | | | 29/419.1 |
| 2004/0080618 | A1* | 4/2004 | Norris | G06K 9/00771 |
| | | | | 348/207.1 |
| 2005/0046567 | A1* | 3/2005 | Mortenson | G08B 21/18 |
| | | | | 340/539.13 |
| 2005/0069911 | A1* | 3/2005 | Lee | B82Y 5/00 |
| | | | | 435/6.14 |
| 2005/0200481 | A1* | 9/2005 | Wallach | G08B 21/08 |
| | | | | 340/541 |
| 2005/0231855 | A1* | 10/2005 | Tran | H01L 45/16 |
| | | | | 360/324.1 |
| 2007/0036389 | A1* | 2/2007 | Rhee | G06T 7/20 |
| | | | | 382/103 |
| 2008/0063400 | A1* | 3/2008 | Hudson | A63H 30/04 |
| | | | | 398/106 |
| 2009/0032683 | A1* | 2/2009 | Knopf | B82Y 10/00 |
| | | | | 250/208.1 |
| 2009/0058593 | A1* | 3/2009 | Breed | G01S 15/88 |
| | | | | 340/5.2 |
| 2009/0059159 | A1* | 3/2009 | Howell | G02C 5/001 |
| | | | | 351/41 |
| 2009/0225300 | A1* | 9/2009 | Barrows | G01P 3/36 |
| | | | | 356/28.5 |
| 2010/0019169 | A1* | 1/2010 | Hartmann-Thompson | |
| | | | | G01N 21/6402 |
| | | | | 250/459.1 |
| 2010/0020166 | A1* | 1/2010 | Levine | G08B 21/12 |
| | | | | 348/82 |
| 2010/0148940 | A1* | 6/2010 | Gelvin | G06F 15/173 |
| | | | | 340/286.02 |
| 2010/0172545 | A1* | 7/2010 | Lim | G06F 3/0317 |
| | | | | 382/106 |
| 2011/0169950 | A1* | 7/2011 | Weaver | G08B 13/1966 |
| | | | | 348/143 |
| 2011/0233382 | A1* | 9/2011 | Solin | H01L 27/14665 |
| | | | | 250/208.1 |
| 2011/0248151 | A1* | 10/2011 | Holcombe | G01S 17/46 |
| | | | | 250/221 |
| 2013/0321581 | A1* | 12/2013 | El-Ghoroury | H04N 5/2257 |
| | | | | 348/46 |
| 2014/0024313 | A1* | 1/2014 | Campbell | H04B 1/3822 |
| | | | | 455/41.2 |
| 2014/0291479 | A1* | 10/2014 | Lu | H01L 27/1443 |
| | | | | 250/200 |
| 2014/0340487 | A1* | 11/2014 | Gilliland | G01S 17/89 |
| | | | | 348/48 |
| 2015/0338447 | A1* | 11/2015 | Gallo | G01T 1/247 |
| | | | | 340/600 |
| 2015/0364017 | A1* | 12/2015 | Hall | G06Q 10/06315 |
| | | | | 340/539.13 |
| 2016/0117898 | A1* | 4/2016 | Kuznetsov | H04N 5/32 |
| | | | | 340/600 |
| 2016/0146800 | A1* | 5/2016 | O'Driscoll | G01N 21/253 |
| | | | | 506/9 |
| 2016/0209369 | A1* | 7/2016 | Putkaradze | G01N 29/022 |
| 2016/0253906 | A1* | 9/2016 | Celikkol | G01S 3/784 |
| | | | | 701/21 |
| 2016/0259337 | A1* | 9/2016 | Ruffier | G05D 1/0094 |
| 2017/0220037 | A1* | 8/2017 | Berestov | G05D 1/0027 |
| 2017/0253330 | A1* | 9/2017 | Saigh | B64C 39/024 |
| 2017/0344056 | A1* | 11/2017 | Kim | H04L 12/2832 |
| 2018/0020319 | A1* | 1/2018 | Kim | H04W 4/021 |
| 2018/0376090 | A1* | 12/2018 | Liu | H04N 5/3745 |
| 2019/0011921 | A1* | 1/2019 | Wang | B64C 39/024 |
| 2019/0018416 | A1* | 1/2019 | Gassend | G05D 1/0231 |
| 2019/0248492 | A1* | 8/2019 | Roldan De Perera | B64C 3/40 |
| 2020/0111342 | A1* | 4/2020 | Hummer | H04M 1/7253 |
| 2020/0258362 | A1* | 8/2020 | Liss | G01N 21/77 |

* cited by examiner

METHODS AND SYSTEMS FOR DETECTING MOTION CORRESPONDING TO A FIELD OF INTEREST

FIELD OF THE INVENTION

The present invention relates generally to a design of motion sensor based on photodetection. More specifically, the present invention relates to methods and systems for detecting motion corresponding to a field of interest.

BACKGROUND OF THE INVENTION

Motion analysis may be used for motion detection and/or moving target recognition applications. These applications may include motion analysis in sports fields, militarized sites, or even in research laboratories. Conventional motion analysis techniques have restrictions with regard to the size of photodetectors or light sensors used for photodetection. Classical photodetectors or light sensors, used for conventional motion analysis applications, are known to be limited in size by a diffraction effect that starts to interact when a lens size is increased. An increase in the lens size may increase the photodetection sensitivity but may not be suitable for smart dust applications that may require a sensor to be invisible or as compact in size as possible. Further, overall reduction in size for smart dust applications may result in reduced photodetection performance parameters such as responsivity, quantum efficiency, and absorbance.

Most of the motion analysis applications may need three major parameters to be tuned without compromising with size. The three parameters may include, a high sensitivity to light, a high contrast detection ability, and/or a high resolution. Unfortunately, for conventional motion analysis techniques, it is difficult to maximize one parameter without compromising the other while still maintaining the sensor size to be compact.

Therefore, there is a need for improved methods and systems for detecting motion corresponding to a field of interest that may overcome one or more of the above-mentioned problems and/or limitations.

SUMMARY

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

According to some embodiments, the present disclosure provides a system that performs motion analysis in a field of interest. Accordingly, the system may include at least one gateway disposable proximal to the field of interest. Further, the at least one gateway may be configured as a two-way interface capable of communicating with a remote monitoring center and the plurality of motion sensors. Further, the system may include a plurality of motion sensors configured to be disposed as a network in the field of interest. Further, a motion sensor may include a photodetector array configured to perform photodetection and further configured to generate digital information representing a sample. Further, the motion sensor may include a processor communicatively coupled to the photodetector array. Further, the motion sensor may include a wireless transmitter communicatively coupled to the processor. Further, the wireless transmitter may be configured to transmit the digital information to at least one of a motion sensor of the plurality of motion sensors and the at least one gateway. Further, the motion sensor may include a power source configured to provide electrical energy to the processor and the wireless transmitter. Additionally, the system may include a plurality of video cameras disposable at a plurality of key locations in the field of interest. Further, each video camera may be configured to capture image sequences associated with a portion of the field of interest. Further, at least one video camera may be further configured to transmit a part of a corresponding image sequence to at least one of the remote monitoring center through the at least one gateway.

Both the foregoing summary and the following detailed description provide examples and are explanatory only. Accordingly, the foregoing summary and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

DETAIL DESCRIPTIONS OF THE INVENTION

Figure 1:
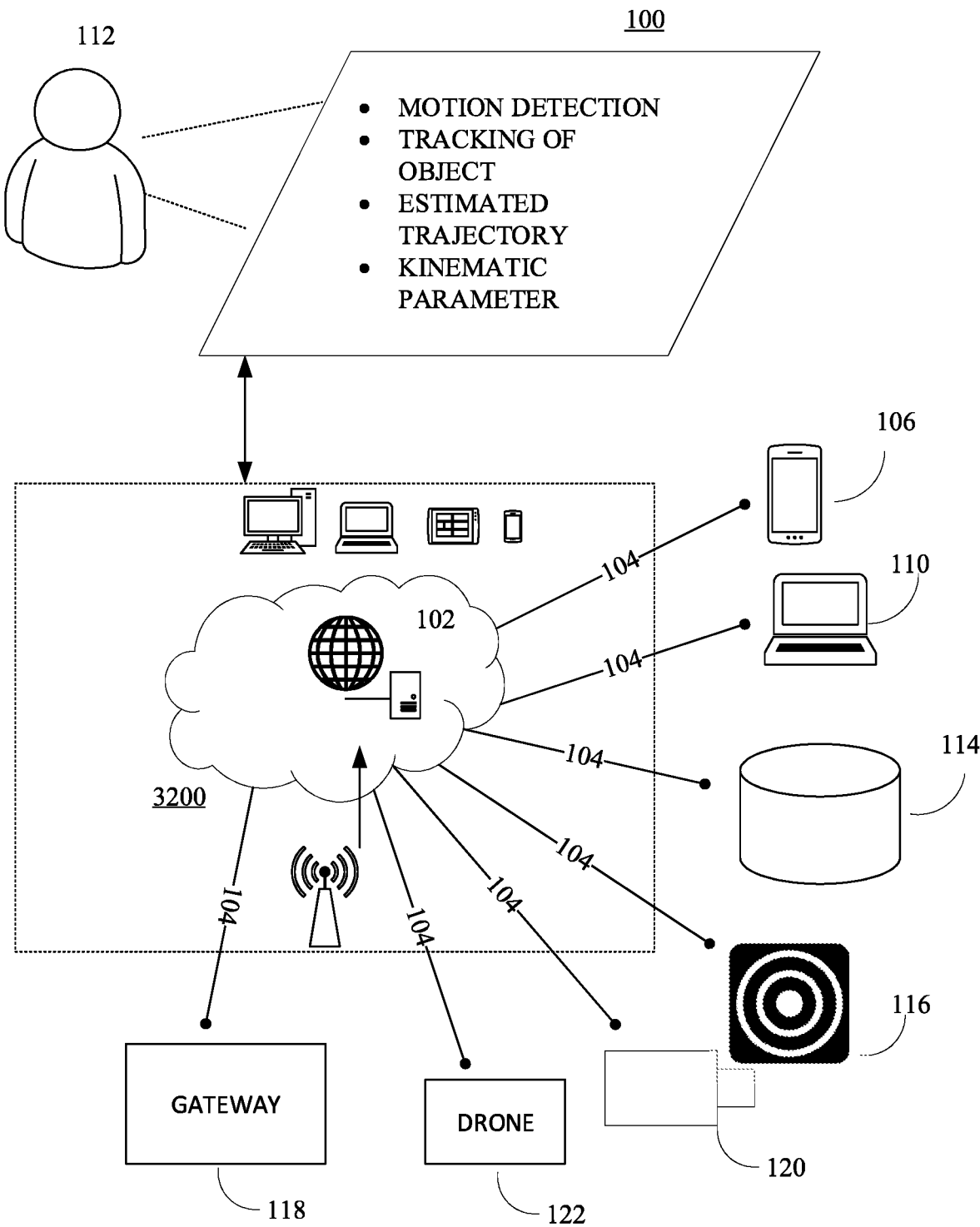
FIG. 1 is an illustration of an online platform consistent with various embodiments of the present disclosure.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of methods and systems for detecting motion corresponding to a field of interest, embodiments of the present disclosure are not limited to use only in this context.

Overview

The present disclosure specifically focuses on a design of motion sensors based on photodetection. A motion sensor, in an instance, may be described with three different implementations corresponding to three different categories of hardware technologies which may refer to CMOS technology, quantum dots, and surface plasmons. The three different categories of implementation may not be totally independent but may follow a progression of technology. The surface plasmons may act simultaneously as exciter and resonator to enhance photodetection through CMOS and quantum dot technologies. Further, the surface plasmons, in an instance, may implement a hybrid device in which nanoscale metal and photodetector building blocks may be assembled together in a highly integrated fashion.

Motion may be one of the most crucial pieces of information. Early before achieving any high resolution, nature developed a vision for motion detection and control for a critical purpose of survival, defense, and hunting. In this context, the present disclosure, in an instance, may intend to develop motion intelligent systems that perform motion analysis, supervision and control on delimited field out of the physical world. A field, in an instance, may be defined as a three-dimensional space and/or time space of interest to be monitored. Examples of such fields, in an instance, may be commercial and business premises, residential, public and administrative buildings, educational institutions (e.g. schools, universities, colleges etc.), parking garages, transportation stations and undergrounds, airports, private properties/residences, city streets, and battle fields etc. Further, the fields may be categorized into three main varieties, namely motion-intelligent buildings, cities, and inaccessible grounds. The ultimate idea is that motion-intelligent fields may have a capability to describe trajectories and recognize all patterns moving in their perimeter, to react appropriately to each moving pattern, to make decisions and to interfere whenever necessary.

A motion analysis, in an instance, may be performed passively and/or actively by sensing electromagnetic and/or acoustic waves which physical properties have been transformed by moving objects.

Further, let us suppose that an operator has actively spread motion sensors randomly over an entire physical field of interest. The motion sensors may be nodes located at the bottom of an entire networking system. The entire networking system may be decomposed into three major components and described with the following bottom-up approach. A set of different sensors captures motion, provides high-resolution information, makes precise measurements, tags moving patterns of interest and converts the information into data to be transmitted. A tree-structured telecommunication system relays the data from the sensors to a data sink or gateway connecting to other means of communication. A remote monitoring center receives the entire data and performs the motion-intelligent supervision and control.

The motion analysis may be performed from digital signals captured from numerous sensors distributed in the field. The sensors belong to one of the following categories. First, the sensor may be a motion sensor. The motion sensors may be passive photodetectors randomly and/or systematically spread in the field. Their (motion sensors) purpose may be to analyze and/or track motion throughout the field of interest through three spectral bands, namely the visible spectrum for optical imaging, the near-infrared for chemical imaging and the mid-infrared for thermal imaging. Second, the sensors may include multiple video cameras. The multiple video cameras may be located in key locations and/or embarked in moving systems such as drones or robots. Their (video cameras) purpose may be to provide high-resolution images and videos for final pattern recognition. Third, the sensors may be active motion measurement devices. The active motion-measurement devices may be based on ultrasonic, microwave, or laser radars. Their (active motion-measurement devices) purpose may be to provide the system with precise measurement of the kinematic parameters for tracking, approach, and capture. Fourth, the sensors may be marking sensors. The marking sensors may be passive walk-through detectors standing on key spots as specialized sensors detecting radioactive, chemical and biological sources, and moving metal pieces. Further, the marking sensors may also include active devices such as active badges. Their (marking sensors) purpose is to mark or label some moving patterns as items of special interest entering in the field, and specifically, to trace their path in the field of interest.

Further, the motion sensors and the network components involved in local telecommunications to routers may be manufactured using innovative nano-technology and Tera-Hertz communications to implement a local Internet of Nano-Things.

At a remote monitoring center, raw data may be reconciled and re-ordered in time and space on an up-dated topographic representation of both the field and the sensor locations originally acquired during the initial training phase. The motion analysis may be performed by a neural network functioning in an adaptive dual control process with two main modes depending on the predictability or the unpredictability of the environment. In the former condition, the dual control proceeds with a deep learning process, and in the later condition, with an expert system. The two main modes can be outlined as follows.

1. The deep learning process relies on an intelligence learned through training and updating phase from a big data source. This process is fast and refers to the empirical way of learning in the field.

2. The expert system is based on the accurate model of the mechanics in the field and the wave capture in the sensors. The expert processing process is slow and refers to the rational way of learning.

In situations of interest, a dual control may also proceed to a third mode that locks the control on specific patterns of interest. A human supervision may also have the possibility to react and sent remote-controlled mobile systems with embarked video-camera like drones or robots on a key location of the field. Under those circumstances, the remote monitoring center would be able to communicate directly with the mobile systems bypassing the network The present disclosure, in an instance, may be based on photodetectors that utilize three main adjacent parts of an electromagnetic spectrum which may include, but not limited to, the visible light with wavelengths ranging from 300 nm to 750 nm, the near infrared with wavelengths ranging from 750 nm to 3,000 nm and the mid-infrared spectrum with wavelengths ranging from 3,000 nm to 15,000 nm. Each part addresses different applications that may be complimentary for the purpose of motion analysis.

The present disclosure, in an instance, may address topics, such as the purpose of the motion analysis system, a nanosensor field, description of nanosensor functions, leading attributes of motion sensors, the photodetector characteristics, the technologies to be implemented.

The present disclosure may include an entire system that performs motion analysis, supervision, and control on a well-delimited field out of a physical world. The well-delimited field, in an instance, may be a field of interest to be monitored. The field of interest, in an instance, may be a three-dimensional space and time referred here by the acronym "3D+T". Examples of such fields, in an instance, may include, but not limited to, commercial and business premises, residential, public and administrative buildings, parking garages, transportation stations or undergrounds, airports, private properties, city streets, and battle fields etc. The motion analysis, in an instance, may be performed from digital signals captured from multiple sensors or sources distributed on the field of interest. The different sources, in an instance, may be assembled into a network. The sensors, in an instance, may be made of photodetection-based sensors acting as motion sensor randomly spread on the field. Further, the present disclosure, in an instance, may include, but not limited to, multiple video cameras situated on key locations, Potential passive or active devices based on acoustic, microwave, laser or radioactive detection positioned on key spots.

Further, an information that may be collected from the nanosensors, in an instance, may be relayed by gateways and transmitted to a remote monitoring center to be processed and analyzed.

Further, the motion analysis, in an instance, may include, but not limited to, a motion detection, a motion-oriented classification & selection, an estimation of kinematic parameters, a parameter prediction, a tracking to build trajectories, and a focalization on patterns of interest etc. Further, the motion analysis, in an instance, may be performed by sensing electromagnetic waves with physical properties that may be transformed or generated by moving objects or patterns. Further, the present disclosure, in an instance, may perform motion analysis passively or actively.

Further, the present disclosure, in an instance, may address an algorithm for motion analysis performed from digital data captured from multiple video cameras and from a network of nanosensors scattered over the field of interest where the 3D+T motion analysis may be performed. Further, the motion analysis may not only mean motion detection, moving target classification and recognition but also estimation, prediction, and tracking of kinematic parameters to build trajectories. A moving target detection and recognition, in an instance, may include a selection through scale and orientation. The kinematic parameters, in an instance, may be defined as spatial and temporal positions, and velocity. Further, the video cameras, in an instance, may provide high-resolution images at locations that may be crucial for moving target recognition and classification capabilities. Further, the nanosensor network, in an instance, may bring motion detection, estimation, and tracking capabilities.

Further, in a typical civilian application, the video cameras may be pre-positioned on key spots and a network of nanosensors may be arranged over the field of interest, at best, on vertical outdoor structures, and on vertical and horizontal indoor structures. Further, in a typical military application, some drones may be equipped with the video cameras and may spread nanosensors as needed on the field of interest. The drones, in an instance, may support locating a position of the nanosensor on the field by triangulation by using their own GPS information. A data collected from the nanosensor network and all images captured from the video cameras, in an instance, may be relayed to a remote control center. Further, the drones, in an instance, may have the ability to move and to focus cameras on targets of interest.

Figure 17:
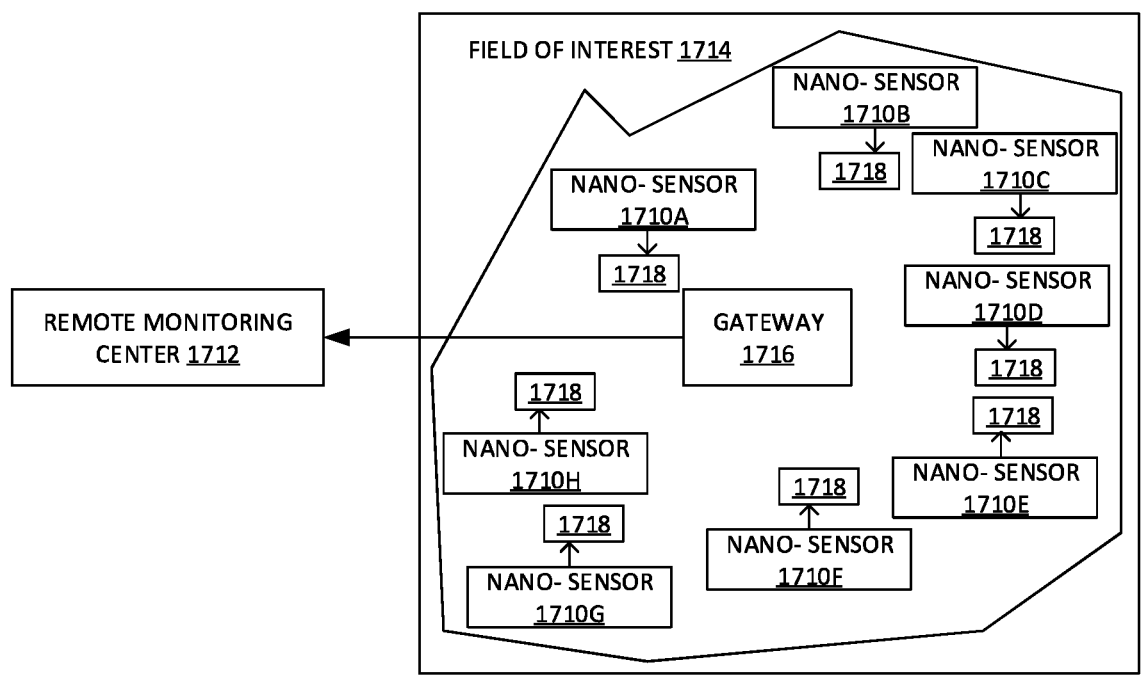
FIG. 17 shows a plurality of motion sensors disposed in a field of interest and communicating with a remote monitoring center through a gateway, in accordance with some embodiments.

Further, the present disclosure, in one embodiment, may include an operator. The operator, in an instance, may actively spread nano sensors randomly in the field of interest. Further, each nanosensor, in an instance, may communicate wirelessly with a gateway. Further, the nanosensor, in an instance, may transmit at its own pace the digital information composed of sampled measurements originating from a photodetector array. Further, a sampled information to be transmitted, in an instance, may contain an identification with a time stamp, and the samples of photodetection. Further, the present disclosure may include several receivers located as gateways in the perimeter of the measurement field. The gateways, in an instance, may collect information and transmit the signals by wire or through the Internet to a remote monitoring center where a computer may perform the analysis. Further, in one embodiment, the nanosensors may be fixed on the surfaces of construction buildings and walls as well as on ceilings. The nanosensors, in an instance, may capture moving light by photodetection. Further, FIG. 17 shows a plurality of nanosensors 1710 along with transmitter/receiver 1718 disposed in a field of interest 1714 and communicating with a remote monitoring center 1712 through a gateway 1716, in accordance with some embodiments. Additional to the nanosensors 1710, a set of video cameras (not shown in the figure), in an instance, may be deployed in the field of interest 1714. The video cameras, in an instance, may transmit video signals by wire or through the Internet to the remote monitoring center.

Figure 18:
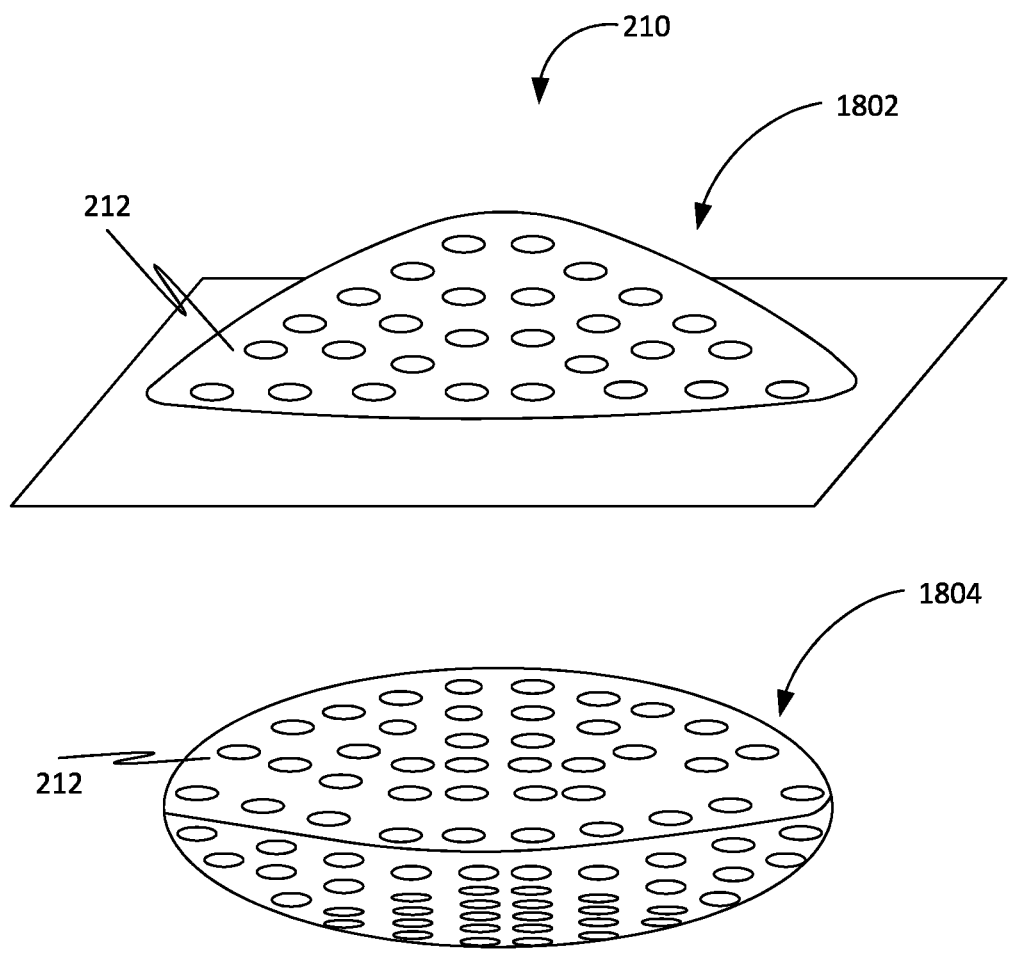
FIG. 18 illustrates a motion sensor constructed with a semilunar shape and a spherical shape, in accordance with some embodiments.

Further, the motion sensor 210, in an instance, may be constructed with a semilunar shape 1802 and/or a spherical shape 1804 as shown in FIG. 18. The semilunar shape 1802, in an instance, may include a convex surface and a flat surface. The convex surface, in an instance, may be covered with the photodetectors in a photodetector array 212. The flat surface, in an instance, may provide attachment to an existing (concrete) structure like a wall and/or a ceiling. Further, the spherical or oval shape 1804 motion sensor, in an instance, may be designed to be free elements that may be equipped with photodetectors to cover all solid angles on whole sphere of $2\pi$ steradians of observation, i.e., all directions. The photodetectors, in an instance, may be implemented to mimic insect vision that may use thousands of individual or independent photoreceptor units. Further, the motion sensor, in an instance, may differ from a video camera where an optical lens concentrates a light to a focal point. The present disclosure may include a plurality of photodetectors that may work individually and independently and may not intend to create a single high-resolution image but instead a multi-element image with as many components as independent units. Further, the present disclosure, in an instance, may superpose or sum the output of several adjacent components during low illuminance period. Further, a compound insect eyes may possess a very large view angle and may detect fast motion, and in some cases, polarized light. Moreover, insects may adapt to nocturnal vision, dimmed lights or cover the near and mid-infrared spectrum. Further, by comparison, a number of photodetector units may highly be variable in the insect world. For instance, a Beetle may have about 300 ommatidia, a dragonfly may have about 30,000, a fruit fly may have about 800, a horsefly may have about 10,000, and a house fly may have about 4,000 ommatidia.

Further, the present disclosure, in an instance, may include photodetectors that may be ideally positioned in an array. The array regularity, in an instance, may not be strictly required but may be just a result of a rational way of fabrication. Further, the number of photodetectors to be implemented may vary from one to one million or more depending on application, allowed size of the nanosensor (from a nanometer scale sensor with 1 to 64 photodetectors to a millimeter scale sensor with one million photodetectors), and way of supplying energy (by cable, batteries, or lifetime harvesting energy). Further, a size of the nanosensor, in an instance, may depend on a final integration of the system in a field environment requesting the nanosensor to be invisible in a smart dust application or allowing to be noticeable or prominent for deterrent purpose.

Figure 19:
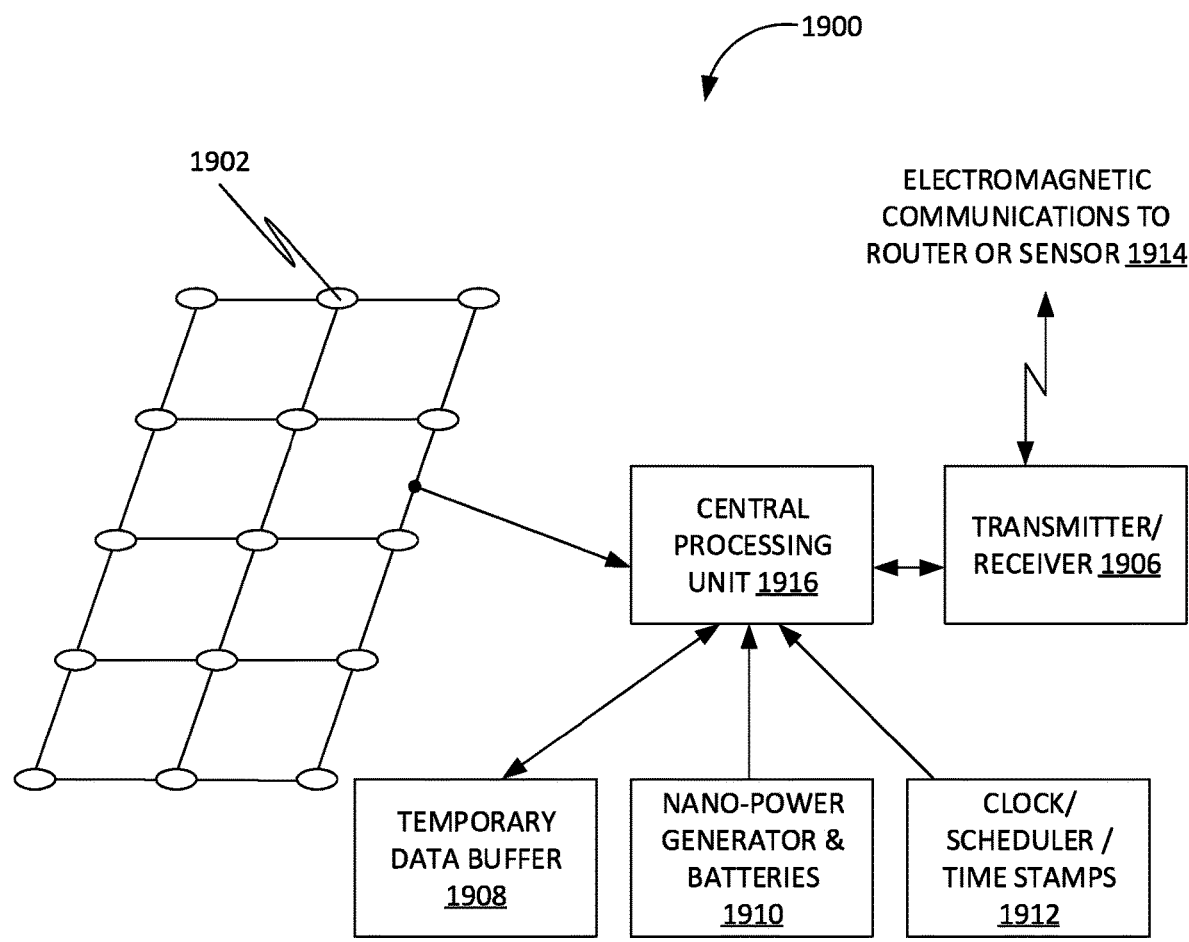
FIG. 19 illustrates a functioning of a motion sensor with a central processing unit, a photodetector array, a transmitter/receiver etc., in accordance with some embodiments.

Further, the motion sensor 1900 (as shown in FIG. 19), in an instance, may also be equipped with some basic signal processing and information storage capabilities, Nano-batteries and wireless communications (using transmitter/receiver 1906). The motion sensor 1900, in an instance, may have the capability to perform a local digital processing (using a central processing unit 1916), clock scheduling and time stamping (using a clock/scheduler/time stamps 1912), memory storage or buffer management, photo-detection through a shaped array of photodetectors 1902, electromagnetic or cabled communications to router or sensor 1914, Nano-Power generation (using a Nano-power generator & batteries 1910), lifetime energy harvesting, and/or Nano-batteries. Further, in one embodiment, the present disclosure may include a temporary data buffer 1908.

Figure 22:
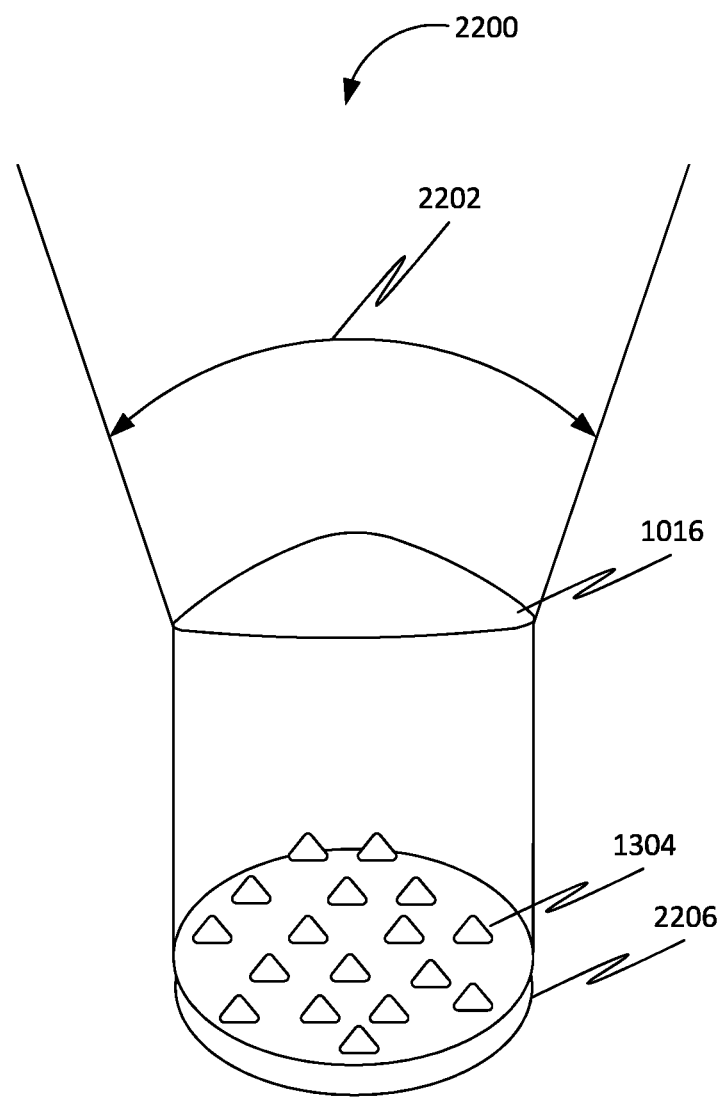
FIG. 22 shows a photodetector including a microlens, a plurality of nanosensor units made of quantum dots in a photodetector substrate, in accordance with some embodiments.
Figure 23:
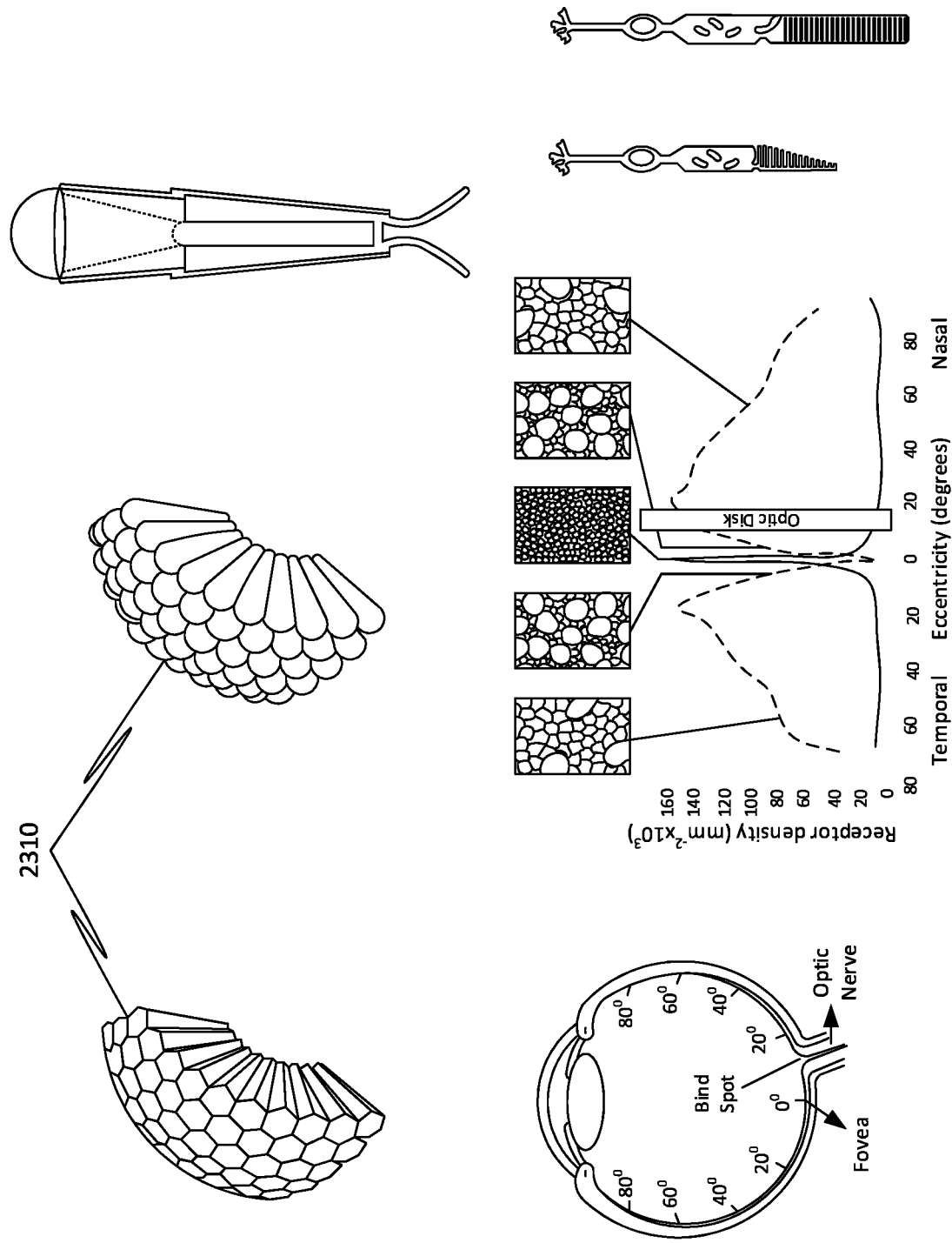
FIG. 23 illustrates a photodetection system for insects and humans, in accordance with some embodiments.

Further, the motion sensor, in an instance, may be composed of an array of photodetector units. Each photodetector 2200 (as shown in FIG. 22), in an instance, may be made of a microlens 1016 funneling the light to a photodetecting substrate 2206. The photodetecting substrate 2206 in an instance, may be fabricated with different technologies involving CMOS detectors, several hundreds of nanosensor units 1304 made of quantum dot (as shown in FIG. 22), or hybrid devices using surface plasmons as a resonator. Further, the photodetector unit, in an instance, may mimic an insect ommatidium 2310 (as shown in FIG. 23). Further, the microlenses 1016, in an instance, may be all independent and arranged in a bundle of individual units.

Figure 20:
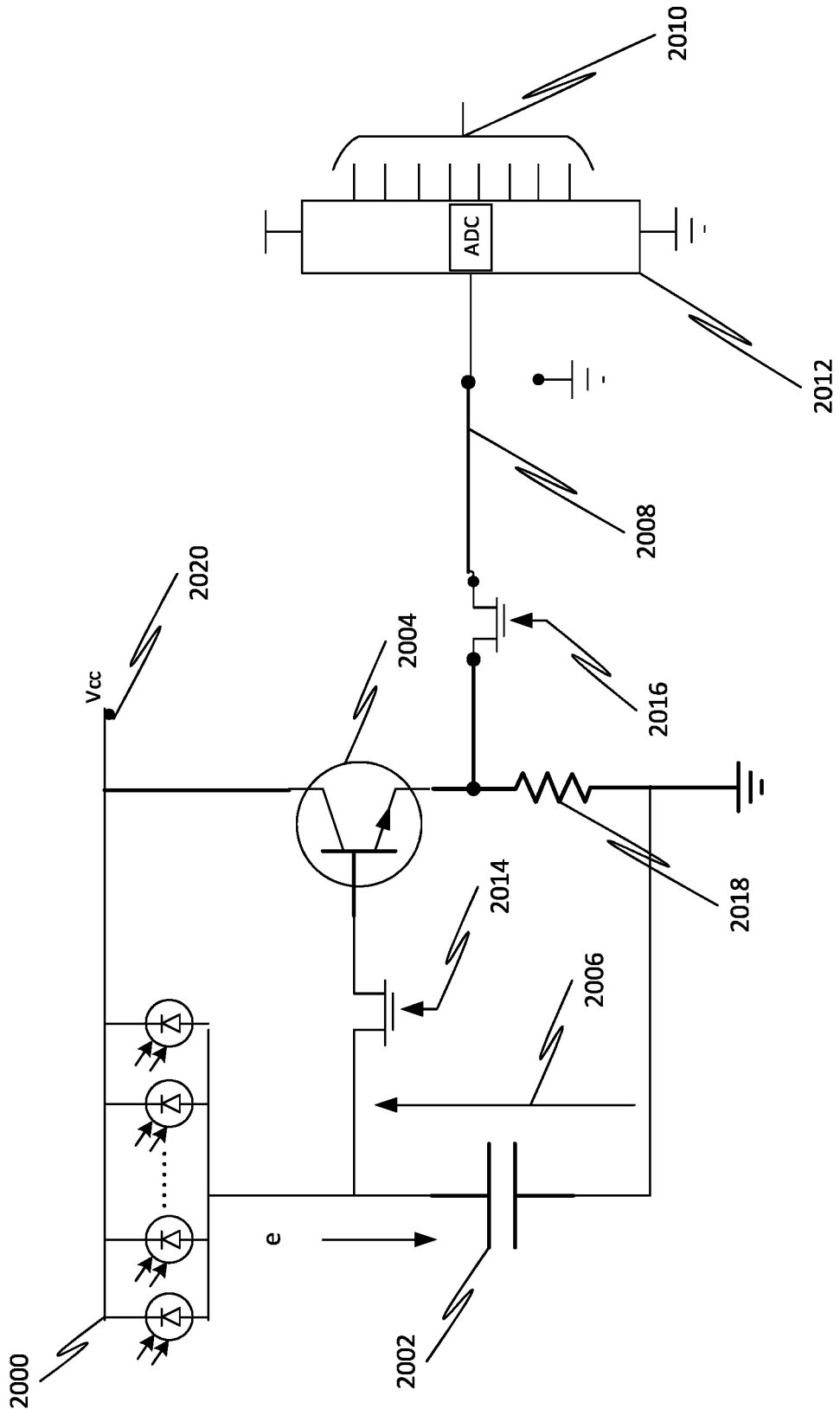
FIG. 20 illustrates generation of an electron from a photon for a motion sensor, in accordance with some embodiments.

Further, the photodetector unit 2000, in an instance, may generate one electron per photon effectively captured, as illustrated in FIG. 20. Further, the photodetector unit 2000, in an instance, may be provided with a voltage source 2020 (say $V_{CC}$) Further, an output of the photodetector unit 2000, in an instance, may be the electrons given to a capacitor 2002 that may get charged by collecting the electrons. The capacitor 2002, in an instance, may be gated by a transistor 2004 in an emitter-follower scheme. The gate, in an instance, may open with a given frequency and the transistor 2004 may allow a readout and a reset. The readout from a readout trigger 2014, in an instance, may sample the value of a voltage 2006 (say $V_e$) sustained by the capacitor 2002. The reset, in an instance, may discharge the capacitor 2002. The readout from a readout trigger 2016 across a load resistor 2018 (say $R_L$), in an instance, may be an analog value (given as an analog signal input 2008) that may be converted to a digital number (such as a binary output 2010) holding on 8, 12 or 16 bits through an analog to digital converter 2012 (ADC 2012). Further, a reading frequency or an integration time, in an instance, may be adapted as per the application. The reading frequency, in an instance, may be typically ranging from 1 per second to a maximum of 100 readings per second, i.e. every 10 milliseconds. Further, the reading frequency, in an instance, may depend on the application, and/or on the actual luminous incoming flux requesting different integration times. For instance, diurnal or nocturnal conditions, and, underground, indoor, or outdoor applications.

The present disclosure may explain the important concepts that may lead to the design of motion detectors. Further, the present disclosure, in an instance, may address a trade-off between resolution and sensitivity, the search for maximizing sensitivity, photon count and contrast. Further, the present disclosure, in an instance, may address a contrast between moving patterns and background scene as a parameter of interest.

A high spatial resolution and a high sensitivity to light may arguably be the two most highly desirable properties of photodetection. Unfortunately, it may be difficult to maximize one property without compromising the other one in a device of a given size. Currently, for most cameras designed by industry, the photodetectors may be packed into a regular array to collectively receive a focused image of the scene. Each photodetector, in an instance, may be responsible for collecting and absorbing light from a single small field of the outside world. Further, each photodetector, in an instance, may define a single pixel in a visual image. In the digital cameras a density of pixels, in an instance, may determine the finest spatial detail that may be reconstructed. Smaller and more densely packed pixels, in an instance, may have the potential to reconstruct or sample finer details. Further, the construction, in an instance, may be similar to a retina in a human eye that may be composed of a highly dense matrix of rod cells for high-resolution purpose. Further, in a quest for higher resolution, the pixel, in an instance, may become too small in size, and may not collect enough light compared to the noise level, and the signal to noise ratio may become lower than 1. The aforementioned situation, in an instance, may exacerbate for dim light conditions. At any given light level, a minimum visual pixel size may be limited by the sensitivity of the photoreceptor. Further, decreasing the size of the photodetectors has a lower bound. Collecting lens-focused light, in an instance, may be limited by a diffraction effect that starts to interact when the lens diameter and detector section reach the order of the wavelength of interest.

Further, the motion analysis, in an instance, may require the photodetector to discriminate contrasts in its field of view between the background scene and moving objects. An ability to recognize an object by the photodetector, in an instance, may extend in dim light. Further, the problem of object discrimination in dim light, in an instance, may lies, at least partially, in the random and unpredictable nature of photon arrival at the photodetector. The development of the photodetector for motion analysis, in an instance, may move the design requirements to high sensitivity and high contrast detection. The high sensitivity and high contrast detection for the present disclosure may make the present disclosure different from a camera sensor that may require a high resolution. Further, the present disclosure, in an instance, may not need an orderly sampling array. The photodetectors may be sparsely distributed but designed with characteristics that may enhance sensitivity, for instance, with larger microlenses 1016 or with a larger angle of view 2202. The present disclosure, in an instance, may mimic a periphery of a retina of the human eye where some cone cells and larger rod cells may be more sparsely spread and perform motion detection (see FIG. 23). For nocturnal or dim light situations larger and more coarsely packed photodetection units, each catching as many of the available photons as possible, may likely to be the preferred design. Further, the present disclosure, in an instance, may privilege sensitivity, photon counts, and contrast against the resolution.

Further, the present disclosure may formalize the features that may maximize the photodetection sensitivity in an equation that accounts for most common type of observable scenes experienced in nature and within man-made construction including buildings and tunnels. In one embodiment, the optical sensitivity may be pulled into perspective and embedded into the equation expressing the total number of photons N absorbed per period of $\Delta t$ seconds from the scene. The number of photons absorbed by a photodetector staring at an extended scene, excluding scenes dominated by stars or other point sources may be given with a good approximation by the formula 1 below.

$$N(\lambda) \approx \Sigma \Omega F_A(\lambda) \phi \eta L(\lambda) \Delta t \qquad (1)$$

Where,

1. $\Sigma$ may be the area of the optical lens. If D may be the diameter of the lens, then $\Sigma = (\pi D^2)/4$.

2. Further, $\Omega$ may be the field of view expressed as a solid angle. An individual receptor may absorb more photons if it views a larger field of space. This may be done by making the photodetector wider or by linking together a number of neighboring photodetectors to create additivity. This effect may be known as spatial summation, and, as more neighbor photodetectors may be tied together, the resulting images get brighter but coarser. This solution lowers the resolution since it reduces the number of independent and effective pixels in an array, but it induces a gain in sensitivity. Applications for motion detection has to work in an opposite way from camera design where increasing the number of pixels, keeping the sensor chip size equal, lowers the ability to work in dim light.

3. $F_A$ may be the absorbance of the detection slab. Assuming that there may be no significant reflections or scattering within the slab, all the light may be either transmitted or absorbed. Therefore, the fraction of light absorbed may be $F_A = 1 - F_T$ where $F_T$ may be the fraction of incident light that may be transmitted. Since a photon traveling through a homogeneous material has a constant probability of striking a molecule and being absorbed, absorbance may be expressed as $A = -\ln(F_T)$. Inverting the relation, we get $F_T = e^{-A}$. 'A' may be further decomposed into the product of an absorbance coefficient defined per unit of length 'a' and a depth 'd', and, since absorbance may be additive, $A = a*d$. Therefore, $F_A = 1 - e^{-a*d}$. In the case of a photodetector where absorbance depends on the wavelength, the practice leads to another way of writing the equation as shown in equation 2 below.

$$FA(\lambda) = 1 - e^{-kA(\lambda)1} \qquad (2)$$

Where 'k' may be the absorption coefficient of the photodetector which describes the efficiency with which the photodetector absorbs light at the peak absorption wavelength. $A(\lambda)$ may be the absorbance of the photodetector normalized to the peak value. In this formalization, all the absorbance spectra have a peak value of one. '1' may be the effective detector depth.

4. $\Delta t$ may be the integration time. The integration time may be a key parameter to control to determine how many photons a receptor may be eventually absorbed. Like a camera may control its shutter speed, a photodetector may control how long it samples photons before performing a readout. Increasing integration time lets in more photons. Therefore, the amount of shot noise relative to the total signal goes down (if n may be the number of photons, the shot noise increases with $\sqrt{n}$), but the amount of dark noise and transducer noise increase. Increasing integration times decreases the temporal resolution and counter the ability to detect fast-moving objects and also blurs the moving patterns contained in the image. Typically, integration times may vary from 1 millisecond to 1 second.

5. $\phi$ may be the transmission of the lens.

6. $\eta$ may be quantum efficiency which may be the fraction of absorbed photons that actually trigger the generation of an electron.

7. $L(\lambda)$ may be the (average) radiance of the filed viewed in the scene.

The product of the first three terms determine the optical sensitivity $S(\lambda)$. Optical sensitivity has a major contribution in photon count.

Since photodetectors may not be spectrometers and may not have broad band spectral sensitivities, all wavelengths have to be accounted. Consequently, the amount of photons to be absorbed may be given by integration over the entire wavelength range as illustrated by equation 3 below.

$$N(\lambda) \approx S \Omega \phi \eta \Delta t f (1 - e^{-kA(\lambda)1}) L(\lambda) d\lambda \qquad (3)$$

Other factors may still be added in the formula. Some, in an instance, may be relevant to plasmonics and express the angular sensitivity, the effects of introducing a waveguide or a resonator.

Further, the illuminance may be a measure of how much luminous flux may be spread or incident over a given area (i.e., the luminous power incident to a surface). The luminous flux may be measured in lumens (lm) and provides a measure of the total amount of visible light present. The illuminance provides a measure in lux (lx) of the intensity of illumination on a surface. The luminance relies on the candela which may be a unit of luminous intensity which incorporates a solid angle in its definition. The candela (cd) may be the luminous flux per unit solid angle (lm/sr). One lux may be equal to one lumen per square meter, therefore, 1 lx=1 lm/m2=1 cd·sr/m2. A source point of one candela emits $4\pi$ lumens (lm) of luminous flux, i.e., one lumen into each steradian surrounding the point. Thus, an extended source such as a TV screen, has a luminance of L candelas per square meter, produces a flux of L lumens per steradian per square meter of emitting surface. Illuminance to be considered with the motion sensors may range from moonless night or dark tunnel values of 0.0001 lx or less to regular daylight without direct sunlight value of 10,000 lx saturating on direct sunlight values of 100,000 lx or more.

Some numbers of available photons may be illustrated in terms of the radiance of a surface. The radiance may be a measure of the number of photons emitted per unit area per second then expressed in photons per square meter per steradian (photons·$s^{-1}$·$m^{-2}$·$sr^{-1}$). Since photon may be emitted in the whole hemisphere in front of the surface, it may be needed to specify the cone over which the photons may be measured. If the measurement may be limited to monochromatic light, then those units may be sufficient. But otherwise if the light may be spectrally complex, then it may be necessary to break up the spectrum into units of wavelength and add $nm^{-1}$, nanometer wavelengths, and the total photon radiance may be obtained by integrating over the spectrum of all spectral elements.

A radiometric system, using energy units (watts=Joules per second), may be the same as a photon number system, except that the units may be watts instead of photons per second. The units may be in $[Wm^{-2} sr^{-1}]$. The conversion factor may be based on Einstein's equation which introduces the dependence to frequency or wavelength $E=h\nu=h*(c/\lambda)$ where c, h, $\nu$, and $\lambda$, in an instance, may represent a speed of light, a Planck's constant, a frequency and a wavelength respectively.

Further, there may be no real interest and information in the absolute luminance of moving object. But instead, information may be in the difference of luminance that allows to discriminate one from the other, and more specifically, from the constant surrounding background. Moving patterns may be recognized under a wide range of lighting conditions. Therefore, the absolute light level does not represent any useful information for motion analysis. The feature of moving patterns that the system needs to catch may be the contrast. Contrast may be a measure of the extent to which one pattern differs from another, and also differs from the surrounding background. The contrast C may be described with equation 4 below.

$$C=(L_1-L_2)/(L_1+L_2)=\Delta L/\Sigma L=\Delta I/2I \quad (4)$$

Figure 21:
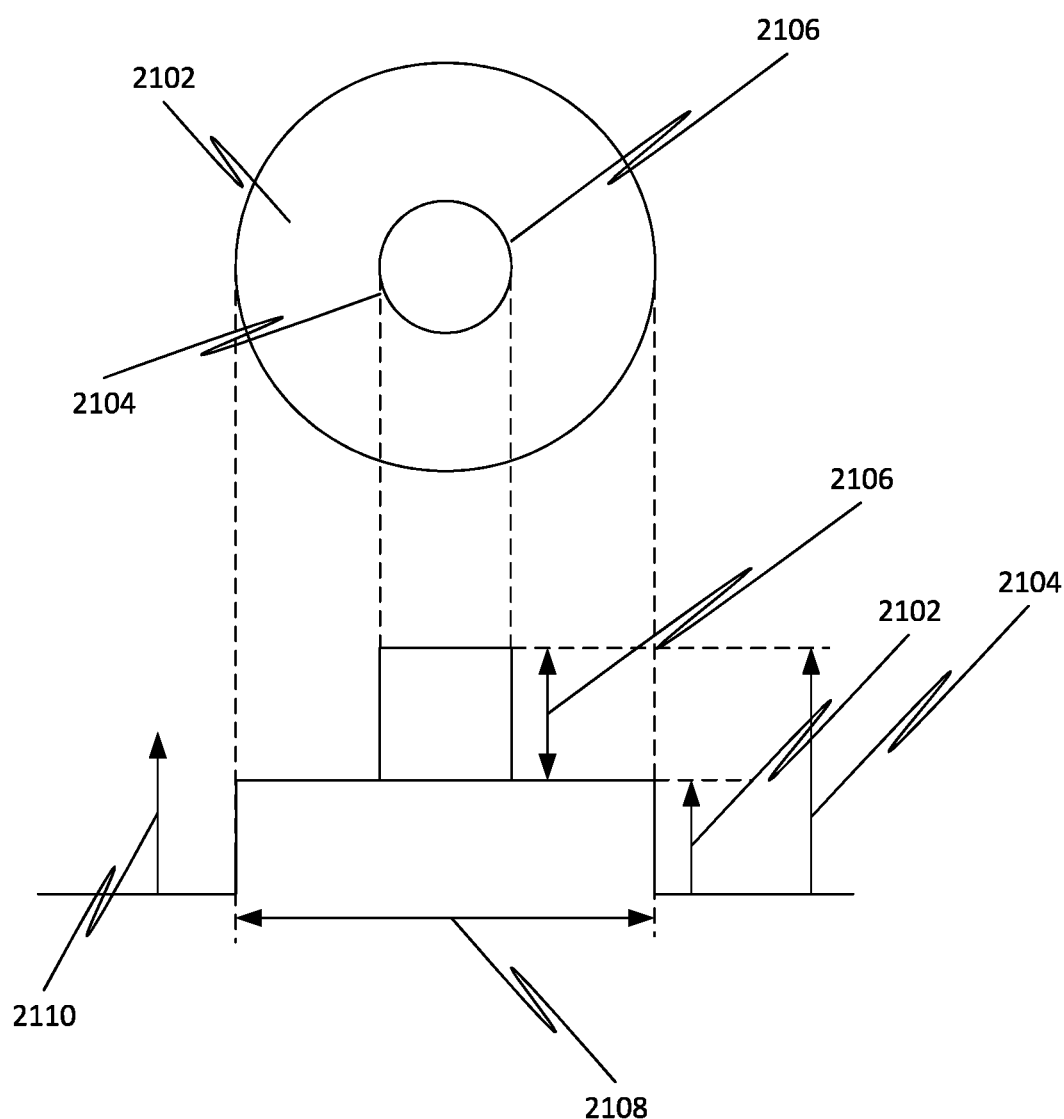
FIG. 21 illustrates a contrast between two surfaces of luminance L1 and L2, in accordance with some embodiments.

The contrast C may be represented by equation 4 for two surfaces of luminance 2102 (say $L_1$) and 2104 (say $L_2$) as shown in FIG. 21. Further, a difference 2106 (say $\Delta L$) in the luminance of the two surfaces may be a subtraction of the luminance 2102 from the luminance 2104. Further, a field of view 2108, in an instance, may be a view from where a recipient may receive light. Further, a resulting luminance 2110 may be directed as shown in the FIG. 21. Further, in term of discriminating between a pair of fields like a background and moving pattern, contrast may be reformulated as the difference of the intensity divided by the sum of intensities or '2I' where 'I' may be an average intensity.

The problem may be to determine how many photons may be needed to detect a given contrast. A difference in the intensity between a background and a pattern may need to be determined. The real difference in intensity, that may be captured and represented in the photodetector in photon numbers, has to be larger than the noise level. The noise level, in an instance, may be the statistical fluctuations in the numbers of photons arriving at the photodetector. The statistics involved may be modeled by Poisson processes. With Poisson process, noise and signal size may be closely related. The variation in photon numbers, measured as the standard deviation, $\sigma(n)$, of repeated samples, may be equal to the square root of the mean number, n, in the sample as $\sigma(n)=\sqrt{n}$. In a single sample pair, we may replace intensities with photon numbers, which gives us the contrast in average photon numbers as $C=\Delta n/2n$. Basic statistical reasoning suggests that the difference between samples, $\Delta n$, should be greater than the standard deviation $\sigma(n)$, and, to give 95% certainty, $2\sigma(n)$.

Therefore, the difference may be detectable if $\Delta n>2\sigma(n)$. To derive the solution, we need to divide both sides of the inequality by 2n and to substitute $\sigma(n)$ by its Poisson correspondence $\sqrt{n}$. The left-end side may be on average equal to the contrast as define here above. The right-end side simplifies to $1/\sqrt{n}$. Therefore, expressing the result in terms of the average photon number may be represented by equation 5 below.

$$n>1/C^2 \quad (5)$$

Equation 5 gives an inequality which tells us how many photons may be needed to be captured at a photodetector to detect particular contrasts.

As a matter of comparison, several laws have been established to describe the Human's ability to visually detect targets on a uniform background. One of those laws may be known under the name of an astronomer, as Ricco's law (1877). This law explains the visual relationship between a target area and target contrast required for detection when that target may be unresolved. It reads as equation 6 below.

$$C=K/\text{Area} \quad (6)$$

Ricco's law may be applicable for targets with an angular area less than the size of the receptive field of view. This field may be variable based on the amount of background luminance. Ricco's law may be based on the fact that within a receptive field, the light energy (which may be related to the number of photons) required to lead to the target being detected may be summed over the area and may be thus proportional to the area. Therefore, the contrast threshold required for detection may be proportional to the signal-to-noise ratio multiplied by the noise divided by the area. This leads to the above equation (equation 6). For Low background luminance L, it leads to the so-called Devries-Rose Equation (1948) as shown in equation 7 below.

$$C \propto 1/\sqrt{L} \quad (7)$$

For Low background luminance L, the above equation 7 may be expressed in the form of average photon number which may be restated as $C>1/\sqrt{n}$.

The radiance of a white card in bright sunlight may be about $10^{20} \cdot m^{-2} \cdot sr^{-1} \cdot s^{-1}$, in room light it may be about $10^{17}$, in moonlight $10^{14}$ and starlight $10^{10}$. This range covers 10 orders of magnitude. The radiance may be then reduced by a factor $10^{12}$ in going from square meters measured in the outside space to the dimensions of the photodetectors which may be measured in square micrometers. This tremendous reduction needs to be compensated by the size of the cone of light accepted by a single photodetector, the integration time and the actual surface or diameter of the microlens 1016. In terms of square degrees, the number of square degrees in a whole sphere may be approximately $4\pi(180/\pi)^2$ $degree^2=41,253^{\circ 2}$. A square degree may be equal to $(\pi/180)^2$ or $3.046 \times 10^{-4}$ steradians[sr]. There may be a total of about 3283 square degrees in a steradian. The angular width of a steradian represents a cone of 65.5° across not the same as a radian, the two-dimensional equivalent, which may be 57.3°. The number of photons available to the photoreceptor may be further reduced by a factor $10^3$ to reach the steradian. The final cut down number of photons available to a photodetector may be brought into a range within which photon numbers 'n' start to limit the detection of contrast 'C'. As we have seen above $C>1/\sqrt{n}$.

Further, a photoconductor sensitivity, in an instance, may be defined as the number of photons n captured per photodetector when the field of view stares at a scene of standard radiance R. As seen above the sensitivity may be shown in equation 8 below.

$$S=n/R=(\pi/4)^2 D^2 \delta \rho^2 F_A \quad (8)$$

Where 'D' may be the diameter of the microlens 1016, and δρ may be the angle of view over which the photodetector accept light, Fa may be the proportion of entering photons that may be captured by the photodetector. The whole optical transformation may be assumed to have here all circular cross-section.

Further, the characteristics that may resolve motion detection under a variety of lighting conditions may include, but not limited to, the photodetectors, in an instance, may have large lens size or may have the ability to be pooled to use the spatial summation property. Further, the photodetectors, in an instance, may have large or wide fields of view to reduce diffraction and to collect enough light to ensure adequate photon counts, and therefore, good contrast detection in dim light. Further, the sampling rate, in an instance, may be reduced to allow longer integration time in dim lights. Further, technology, in an instance, may be chosen to privilege increase of the factor of absorption.

Further, a large lens size may sacrifice the spatial resolution and a longer integration time may sacrifice the temporal resolution for the purpose of detecting finer contrasts and motion.

Further, the photodetector selection and function, in an instance, may rely on some performance characteristics that have to be taken into account to ensure the functionality of the system and meet the goal of motion detection. Those characteristics may be itemized as follows.

1. Responsivity (R): The responsivity parameter 'R' reflects the gain of the detector and may be defined as the output signal, typically voltage or current, of the detector produced in response to a given incident radiant power falling on the photodetector:

$$R_V = V_S/P_o \text{ or } R_I = I_S/P_o \tag{9}$$

Where, Vs may be the output voltage [V], $I_S$ may be the output current [A] and $P_o$ the radiant input power [W].

2. Spectral response: When the definition of responsivity may be expanded to include the wavelength dependence, then the responsivity may be known as the spectral responsivity $R(\lambda)$. Three main frequency bandwidth may be exploited in the applications. These three main frequency bandwidth, in an instance, may include the visible imaging spectrum with wavelengths ranging from 300 nm to 750 nm, the near-infrared spectrum for chemical-imaging with wavelengths ranging from 750 to 3,000 nm, the mid-infrared spectrum for thermal imaging with wavelengths ranging from 3,000 nm to 15,000 nm. Each bandwidth, in an instance, may be addressed by different technologies.

3. Response time: Similar to any other transducer, any photodetector exhibits a characteristic transient behavior when the radiant power changes abruptly. A general definition of the response time, τ, for any sensor systems may be the time it takes for a transient output signal to reach 63.2% of its final steady-state value. The expression of the responsivity in the time and frequency domain may be given by equation 10 and 11 below.

$$R(t) = R_\infty (1 - e^{t/\tau}) \tag{10}$$

$$R(f) = R_0/\sqrt{(1+(2\pi f \tau)^2)} \tag{11}$$

Where $R_0$ may be the DC responsivity. In the time domain, τ, the cut-off frequency may be the half-point or the frequency at which the responsivity may be 0.707 of the DC responsivity. With quantum detector, the intrinsic response time may be less than a nanosecond. Although the response time of quantum infrared detectors may be often limited by high-impedance electronic readout circuit, their overall response times may be commonly shorter than $10^{-3}$ sec. This satisfies the requirement of the real-time infrared imaging requirement. The response time to any instantaneous change in radiant energy may be less than 0.1 ms.

4. Linearity: Photodetectors may be characterized by photocurrent or voltage response that may be linear with the incident radiation over a wide range since the photodetector may be counting photons. Any variation in responsivity with incident radiation represents a variation in the linearity of the detector. If the output voltage of the detector may be plotted versus the radiation level, the slope of the line from the lowest level of radiation to the highest level may not deviate from linearity. Linearity may be stated in terms of a maximum percent deviation from a straight line over a range of input radiation levels covering 8 to 10 decades of illumination. The Noise in the detector may determine the lowest level of incident radiation detectable. The upper limit of this input/output linearity characteristics may be established by the maximum current capability that the detector may handle without becoming saturated. The maximum deviation from a straight may be over the range $10^{-12}$ W $cm^{-2}$ to $10^{-4}$ W $cm^{-2}$ incident radiation may be less than 5 to 10%.

5. Quantum efficiency (QE): The quantum efficiency may be the ratio of countable events, in this case electrons, generated by the incident photons. The quantum efficiency may be related to the responsivity since it may be equal to the current responsivity times the photon energy in electron volts of the incident radiation. It may be expressed as a percentage. Typically, quantum efficiency varies from 3% to 70%.

6. Shot noise: The shot noise or photon noise may be present in all photon detectors due to a random arrival rate of photons from the radiant energy under measurement and the background radiation. Photon noise may be modeled as a Poisson process and may be the true limitation of the photodetector performances.

7. Noise equivalent power (NEP): The minimum radiant flux that may be measured by different photodetectors with the same responsivity may be inversely proportional to the level of total intrinsic noise in the photodetector. A convenient way to characterize the sensitivity of a photodetector may be to specify its Noise Equivalent Power (NEP). The NEP may be a parameter defined as the radiant power incident on the photodetector that produces a signal equal to the root mean square (rms) photodetector noise. The NEP may be quoted using a measurement bandwidth of 1 Hz. The NEP increases as the square root of the measurement or detection bandwidth. Let us decompose all contributions as follows. Considering first the actual photonic current $I_{ph}$, we have equation 12 as shown below.

$$\sqrt{i_{rms}^2} = I_{ph} = R_I E_e A_d \Delta \rho \tag{12}$$

where $i_{rms} = \sqrt{\{(1/n)(i_1^2 + i_2^2 + \ldots + i_n^2)\}}$ may be the rms value of signal current at the output detector, $T_{ph}$ may be the photonic current, $R_I$ may be the responsivity in [mA W$^{-1}$] at the wavelength of the incident radiation, B may be the bandwidth, $E_e$ may be the radiance of the incident radiation in [W cm$^{-2}$ sr$^{-1}$], and $A_d$ may be the radiated area of the photodetector in [cm$^2$] and $\Delta \rho$ may be the field of view in [sr]. The noises may be adding their variances since they may be independent, and therefore, adding their square rms current values when expressed in the NEP. Photodetector noise may be composed of shot noise or photon noise, and dark noise the signal to noise ratio may be given by equation 13 below.

$$(S/N) = I_{ph}/\sqrt{\{i_{rms,s}^2 + i_{rms,dc}^2 + i_{rms,th}^2\}} \tag{13}$$

where $i^2_{rms,s}$, $i^2_{rms,dc}$ and $i^2_{rms,th}$ may be the shot noise, the dark noise and the thermal noise respectively, expressed as square rms currents. We may have: $i^2_{rms,s}=2eI_{ph}B$, $i^2_{rms,dc}=2eI_DB$, $i^2_{rms,th}=4kTB/R$. Where, B may be the bandwidth of the entire detection system, e the electron charge, T the absolute temperature, R the resistance and k the Boltzmann constant.

8. Detectivity (D and D*): When several photodetectors may be compared, the one with the highest output for a given radiance input may be said to have the best responsivity. However, when comparing the photodetectors in terms of their detecting ability, we want to compare them in terms of the minimum detectable radiant flux. The best detector may be the one with the lowest NEP. However, a figure of merit that may be directly proportional to the detector performance may be more convenient. The define the inverse value of the NEP may be then chosen to define a parameter known as the detectivity, D. The directivity may be still a function of the area of the detector, the bandwidth of the measurement system, the sampling frequency, the bias voltage, the wavelength of radiation and the temperature of the detector. Taking into account the detector absorbing active area, Ad and the signal bandwidth, B, one may define a normalized detectivity D*, as shown in equation 14 below.

$$D^*=\{\sqrt{(A_dB)}\}/NEP \quad (14)$$

Where the unit of D* may be expressed in [cm Hz$^{1/2}$ W$^{-1}$].

9. Noise Equivalent Temperature Difference (NETD): NETD may be a parameter characterizing the low-signal performance of thermal imaging systems and may be more applicable to infrared photodetectors. NETD may be defined as the temperature of a target above or below the background temperature that produces a signal in the detector equal to the rms detector noise. NETD may be limited by temperature fluctuation noise while background fluctuation noise imposes an absolute theoretical limit on the NETD. NETD may also be expressed for a given detector area, detector absorptivity, optical transformation, and output signal bandwidth as shown in equation 15 below.

$$NETD=(V_N/V_S)(Tt-Tb) \text{ or } NETD=(I_N/I_S)(Tt-Tb) \quad (15)$$

Where, $V_N$ or $I_N$ stands for voltage or current rms noise, $V_s$ or $I_s$ for the voltage or current signal. $T_t$ may be the temperature of the blackbody target and Tb may be the background temperature.

Further, the motion sensor, in an instance, may be made with a semilunar shape similar to the insect visual system as shown in FIG. 18.

Figure 24:
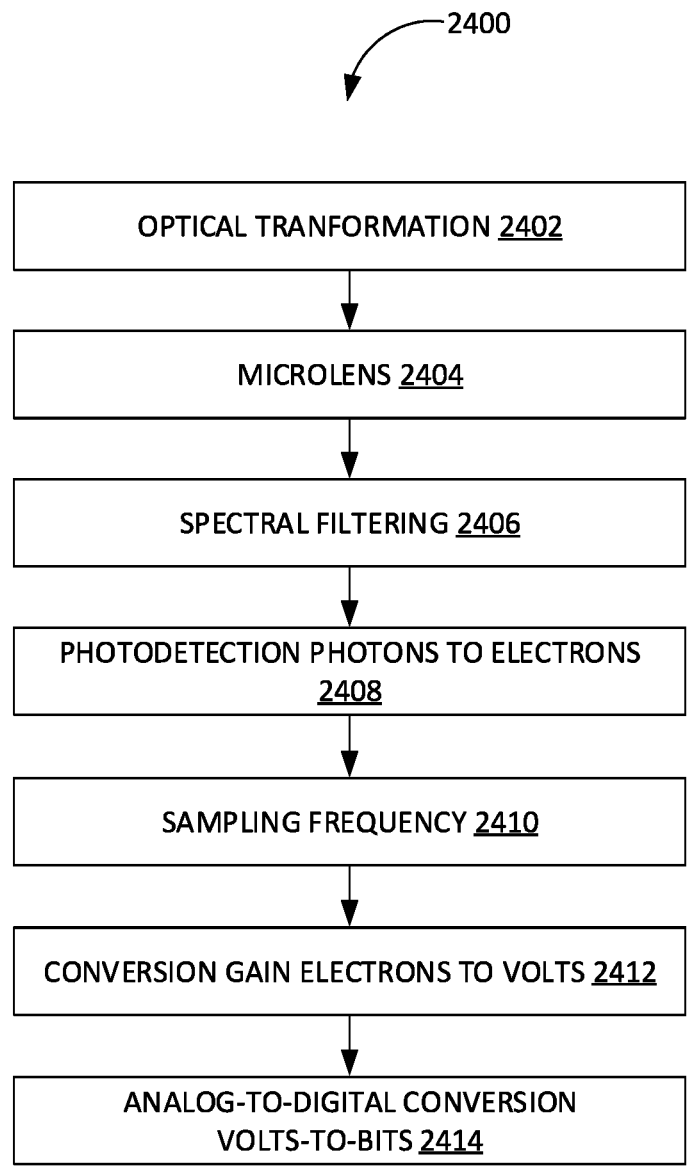
FIG. 24 illustrates a cascade of operations involved for a photodetection, in accordance with some embodiments.

The photodetection, in an instance, may involve a cascade of operations 2400 (with reference to FIG. 24). The cascade of operations 2400, in an instance, may include an optical transformation 2402, microlens 2404, spectral filtering 2406, photodetection photons to electrons 2408, sampling frequency 2140, a conversion gain (from) electron to voltage 2412, an analog-to-digital conversion volts-to-bits 2414. The resulting electronic circuit may be presented with FIG. 20.

Figure 25:
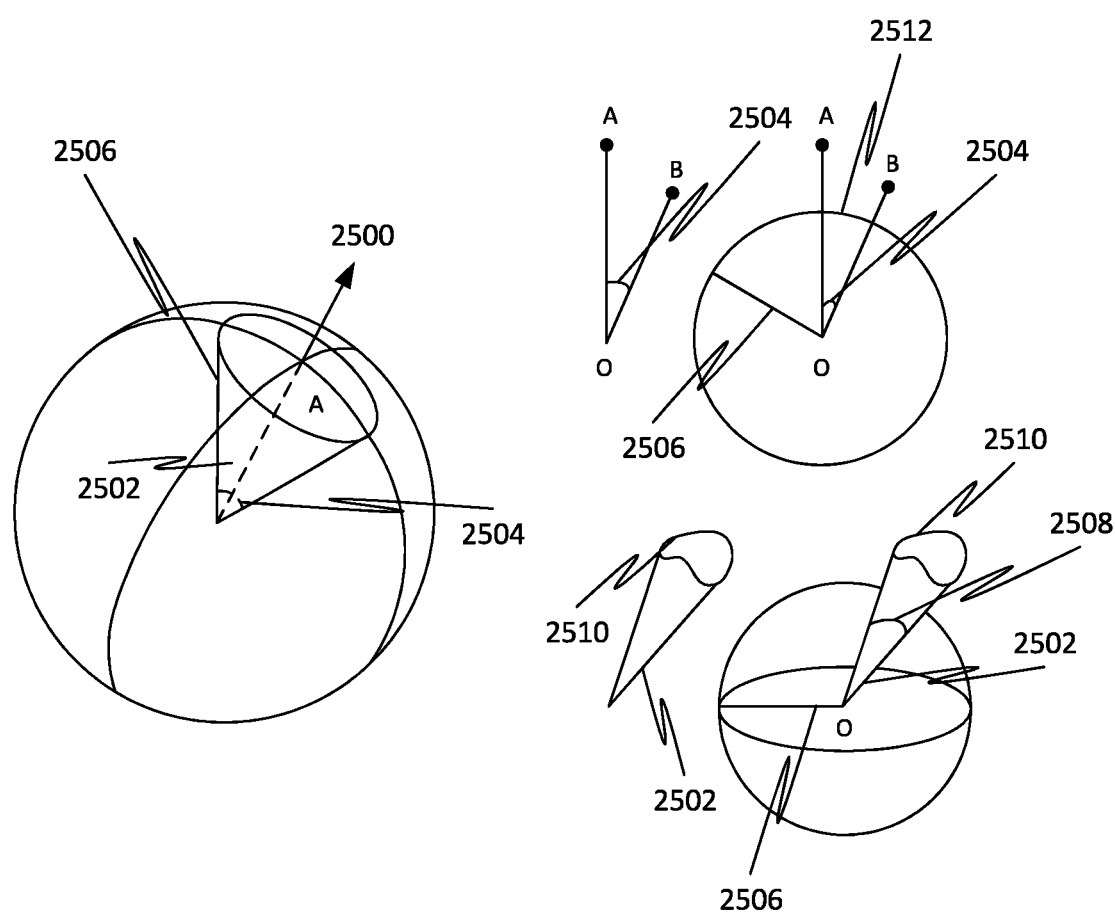
FIG. 25 illustrates a relation between a plane angle (radian) and solid angle (steradian), in accordance with some embodiments.

Further, the photodetectors 2200, in an instance, may have a lens with an optical property to capture content of a scene within a given solid angle of view 2202 determining a three-dimensional cone of observation (as shown in FIG. 22). Each photodetector 2200, in an instance, may be independent of its neighbor, a situation that mimics insect vision and not Human vision. Insects, in an instance, may have a compound visual system and one brain, while humans may have one visual system and a multi-brain. An angular extent of the given scene captured may be referred as an angle of view 2202. Further, in one embodiment, the angle of view 2202 may be contained in a solid cone whose cross-section subtends angles from 0 degrees to 180 degrees or 0 radians to 3.14 radians. The solid cone as illustrated in FIG. 22, in an instance, may be defined as the angle of view 2202 and/or the field of view. Further, with reference to FIG. 25, numerically, the number of steradians in a sphere may be equal to the surface area of a sphere of radius 2506 (say r) with a unit radius, i.e., area of sphere=$4\pi r^2$, but with r=1, area=$4\pi$. For a regular cone with a conical angle view 2500, the solid angle 2502 (say $\Omega$) of the cone whose cross-section subtends the angle 2504 (say $\theta$) may be equal to $\Omega=2\pi \times (1-\cos(\theta/2))$. Where $\theta$ may be the plane angle of a cone. For example, a hemisphere (half ball) has a plane angle of it radian may have a solid angle 2502 of $2\pi$ steradians. In this case, the covered solid angle field of view expressed in steradians may range from 1 steradian to $2\pi$ steradians. Further, $\theta$ may be equal to a length of arc 2512 (say 1) divided by the radius 2506 of the sphere. Further, a curve 2510 (say curve C) may have an area 2508 (say a) on the surface of a sphere. Further, $\Omega$ may be equal to the area 2508 divided by a square of the radius 2506 of the sphere.

Further, the microlenses, in an instance, may be circular-shaped with diameters that may vary from 1 μm to 50 μm or may correspond to an area ranging from $3.142 \times 10^{-8}$ cm$^2$ to $7.854 \times 10^{-5}$ cm$^2$. Further, the size of the microlens, in an instance, may depend on a frequency with a rule of thumb that the diameter may be about 2 times the maximum wavelength of interest.

Further, a spectral filtering, in an instance, may determine the frequency band of interest described in the spectral response properties.

Further, the photodetection, in an instance, may convert the incident photons into electrons according to a quantum efficiency, typically 3% to 70%, or max 80%. The electrons, in an instance, may eventually be collected to charge a capacitor.

Further, the sampling frequency, in an instance, may determine a time elapsed between two consecutive sampling instants and may vary from 33 ms to 1 ms which corresponds to sampling frequency between 30 Hz and 1 Hz. The sampling rate may be adapted as per luminosity of the illuminance under different environments in lux (example, 10,000 lux daylight without direct sunlight), the conversion gain from electron to voltage, in an instance, may be in the range of 1 to 10 μV/e.

Further, a photodetector noise, in an instance, may be measured in equivalent number of electrons in rms voltage or in rms current. For instance, 20 e rms noise may be 20 μVrms at 1 μV per electron.

Further, the photodetectors, in an instance, may be implemented using, but not limited to, a classical approach with different material, a quantum dot and/or quantum wall, a plasmonic etc.

Eventually, the technology build-up and hybridization capabilities offered by the plasmonic versions, in an instance, may converge to a photodetection system that may mimic the insect ommatidium 2310 (as shown in FIG. 23). The insect ommatidium 2310, in an instance, may include a microlens funneling a radiated flux to one or many resonators filled with quantum dots based made of diodes or light-sensitive biomolecules that transform the photons into electrons. Analogous to a protein that converts photons into an electron in humans and a rhodopsin in insects.

A photodiode, in an instance, may be a pn junction or PIN structure. When a photon of sufficient energy strikes the diode, it creates an electron-hole pair. This mechanism may also be known as an inner photoelectric effect. If the absorption occurs in the junction's depletion field, or one diffusion length away from it, these carriers may be swept from the junction by the built-in electric field of the depletion field. Thus, holes move toward the anode and electrons move toward the cathode, and a photocurrent may be produced. The total current through the photodiode may be the sum of the dark current (current that may be generated in the absence of light), the shot noise current and the photocurrent corresponding to the amount of photon that may be actually detected. The photodetectors may be based on semiconductor materials with narrow bandgaps, $\epsilon<h/\lambda$ or metal-semiconductor structures (Schottky barriers) with appropriately small energy barriers $\Delta\epsilon<h/\lambda$. Because of the nature of photo-excitation and thermal-excitation process in semiconductors, photonic infrared detectors exhibit a strong wavelength dependence and thermal noise dependence.

Figure 26:
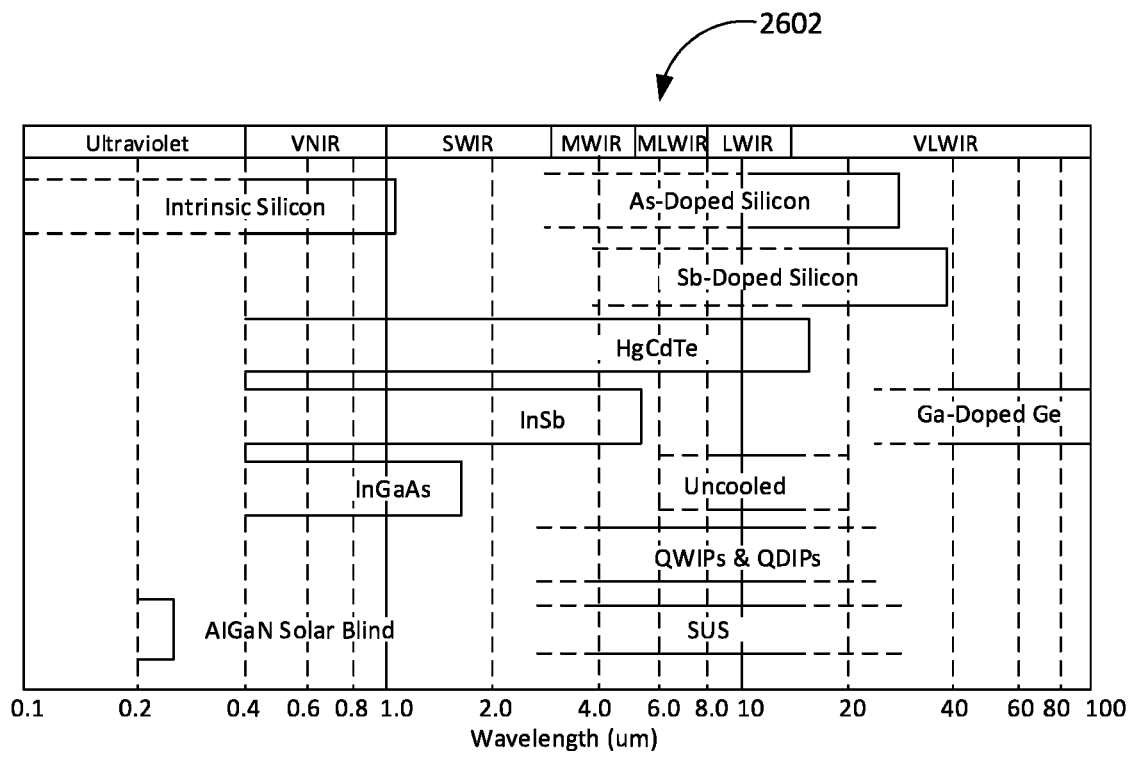
FIG. 26 illustrates a variation of responsivity with a wavelength range for different photodetector materials, in accordance with some embodiments.
Figure 26:
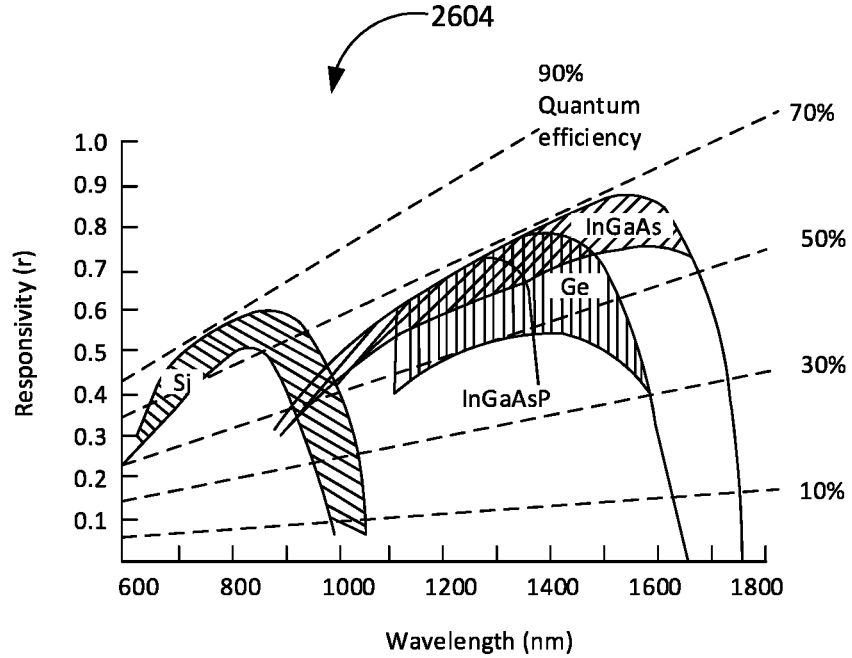

According to the particular choice of the material used in the photodetector different spectral bandwidth may be addressed as shown in FIG. 26. Further, a variation of responsivity with a wavelength of various semiconductor materials, in an instance, may be described with a graph 2604. The semiconductor material used to make a photodiode, in an instance, may be critical for defining its spectral responsivity. The reason may be that only photons with sufficient energy may be able to excite electrons across the material's bandgap to generate significant photocurrents. Further, a spectrum diagram 2602 shows some useful bandwidths with instance of semiconductors used to implement the photodetector. Further, some useful bandwidths with instance of semiconductors used to implement the photodetector, in an instance, may include, but not limited to, a visible light and a near-infrared ranging from 700 nm to 1,000 nm by using silicon-based photodetectors, The short-wave infrared of wavelength 1,000 to 3,000 nm by using InGaAs (indium gallium arsenide) based photodetectors, the mid-wave infrared of wavelength ranging from 3,000 nm to 5,000 nm by using InSb, HgCdTe, PbSe based photodetectors, the long-wave infrared of wavelength ranging from 5,000 nm to 15,000 nm by using HgCdTe based photodetectors.

Further, the photodetectors based on quantum dots, in an instance, may enable new imaging possibilities in the visible light spectrum, the near-infrared spectrum and also peak detection wavelengths in the mid-wave infrared at room temperature. For a surface of diameter equal to 25 μm, 90,000 quantum dots, the responsivities, in an instance, may be estimated to be in the range of 10 to 100 mA/W, the detectivity, in an instance, may be of the order of $10^7$ to $10^8$ cm $Hz^{1/2}$/W at room temperature. The NEDT, in an instance, may range from 200 mK to 500 mK. The quantum efficiency, in an instance, may range up to 50% by optimizing the quantum-dot growth to produce stronger light or IR absorption. The peak detection, in an instance, may be at a wavelength of 4.1 μm. For instance, the quantum dot infrared photodetector, in an instance, may include stacks of tens of hybrid structure of InAs (indium arsenide) quantum dots and InGaAs (indium gallium arsenide) quantum well with AlInAs (aluminum indium arsenide) as a barrier. The whole device structure may be grown, for instance, by a low-pressure metal-organic chemical-vapor deposition technique. The InAs quantum dots may be grown, for instance, by self-assembly following a Stranki-Krastanov growth mode.

The photodetector 2200, in an instance, may be composed of a lens of diameter 1 μm to 50 μm that may funnel the light to a photodetector substrate 2206 with a plurality of nanosensor units 1304 made of quantum dots. The size of the quantum dots, in an instance, may vary in diameter from 2 nm to 50 nm with a typical value of 10 nm. Considering an average distance between two neighbor quantum dots of 30-70 nm in average, the number of quantum dots covered using a photodetector substrate 2206 with 2 μm diameter corresponding to the same size microlens 1016 may be in the range 3,480-640 units. At a diameter of 25 μm, the number of quantum dots may be in the range 545,000-100,000.

Figure 27:
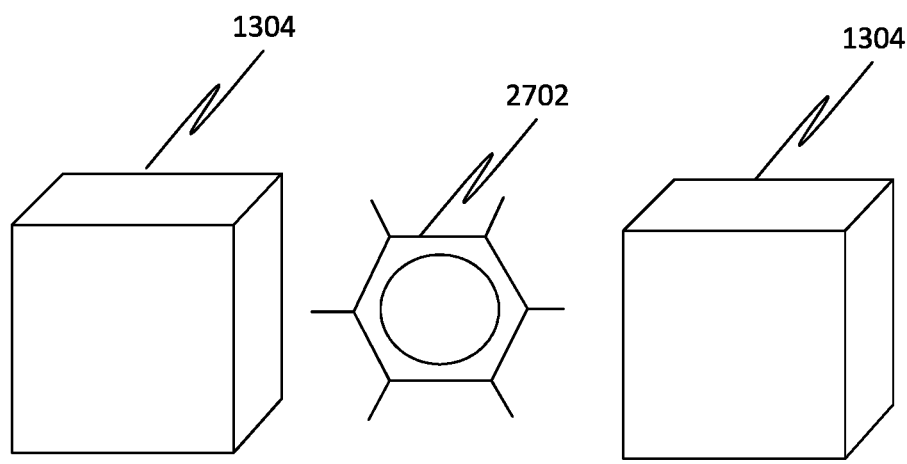
FIG. 27 shows a biomolecular quantum dot, in accordance with some embodiments.

Further, FIG. 22 illustrates a construction of a photodetector 2200 with nanosensor units 1304 made of quantum dots. Further, FIG. 27 shows that a quantum dot, in an instance, may be designed with a biomolecule 2702. Further, the biomolecule 2702 may be sensitive to photons and may be able to convert a photon to a conducting electron. Further, like the rhodopsin molecule, the quantum dot may become a photodetector.

Further, nanotechnology has enabled the realization of hybrid devices and circuits in which nanoscale metal and semiconductor building blocks may be woven together in a highly integrated fashion. In electronics, it may be well known how the distinct material-dependent properties of metals and semiconductors may be combined to realize important functionalities. The Photodetection may be one of those functionalities. The present disclosure, in an instance, may include an optoelectronic device for which the geometrical properties of the constituent semiconductor and metallic nanostructures may be tuned to implement at the nanoscale performances that may be comparable to those obtained at the microscale. The structure, in an instance, may belong to a new class of devices that capitalize on the notion that nanostructures have a limited number of resonant, geometrically tunable optical modes whose hybridization and intermodal interference may be tailored in numerous useful ways.

Further, the present disclosure may include plasmons. The plasmons, in an instance, may be used to enhance the photodetectors. A surface plasmon, in an instance, may provide near-field enhancement and concentration of light into a nanoscale photodetector which may result in an increased absorbance, responsivity and quantum efficiency. The surface plasmon excitation, in an instance, may concentrate an incident light even with sizes that may be below a diffraction limit. A classical photodetector scaling may be limited in size by the diffraction effect that may start to interact when the lens size and may reach a diameter of the order of the wavelength to be detected and vertically by a large absorption depth in conventional semiconductors. Both limitations may be intrinsically related to the interaction of light with the active field of the photodetector and may diminish the photodetection performance parameters such as responsivity, quantum efficiency, and absorbance. The introduction of nanostructure supporting surface plasmon excitation, in an instance, may decrease the photodetector size to the nanoscale while increasing the photodetector responsivity by concentrating the incident light below the diffraction limit. A design methodology may consist of maximizing resonant transmission power throughput of light on the active field of the photodetector. A nanoring 2802, in an instance, may act as a localized surface plasmon excitation and as a resonant transmission of light (see FIG. 28). The design, in an instance, may achieve a significant field amplification by a factor of about 200 times in the near-field zone inside the nanoring. This amplification may counter and compensate the decrease in responsivity that may result from the volume shrinkage of the active photodetector size.

Indeed, since the gold or metallic structure may be in form of a ring that displays a hole in the middle, the photodetector material, in an instance, may be inserted in the central hole to realize the hybrid device. The absorbance and quantum efficiency may also be enhanced with the hybrid device. The transmission power throughput (TPT) of light from a given aperture, in an instance, may be a ratio of transmitted power to the incident power over the aperture. A TPT value of greater than unity for the central hole of the nanoring 2802 at resonance wavelength may show an ability of the hole to capture power from a larger area of the aperture cross-section, which may result in a larger photocurrent value. The TPT that may be expected with a nanoring 2802 may be of the order of 200%.

Further, the responsivity 'R' may drop in a nanoscale-size photodetector when compared to their microscale-size corresponding version due to the decrease of the photocurrent arising from active field volume shrinkage. The purpose of a design at the nanoscale may be to achieve a high responsivity while minimizing the active field. In one embodiment, a design of a classical photodetector at a microscale (for instance, a Ge-Schottky diode designed at a volume of 950 µm$^3$) may be brought down to a nanoscale diode to be incorporated in a gold nanoring. The hybrid result, in an instance, may be a gold nanoring encircling a Ge-Schottky photodetector. The nanoring, for instance, may have an external radius $R_2$ of 110 nm and internal radius $R_1$ of 90 nm. The nanoring, in an instance, may have a height H of 90 nm. The hybrid structure made, for instance, of Au-nanoring and Au—Ge Schottky junction may hold in a volume of $10^{-3}$ µm$^3$ and may provide a resonance for a wavelength of 1,500 nm.

Further, the present disclosure, in an instance, may include a photodetector substrate 2206 made of quantum dots into the nanoring. This leads to a general hybrid device where the photodetectors, in an instance, may be made of classical diodes rescaled at the nanoscale, of stacked quantum dots as described in the previous section, or of stacked biomolecules.

Figure 29:
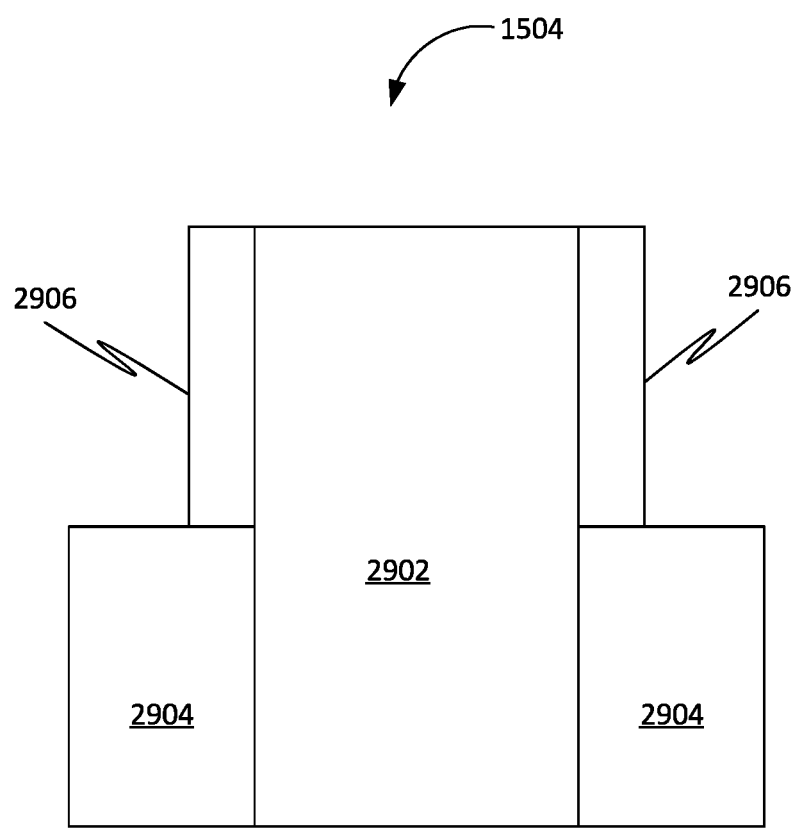
FIG. 29 illustrates a plasmonic hybrid device, in accordance with some embodiments.

A plasmonic hybrid device 1504, in an instance, described in FIG. 29 may work as a photodetector unit without predetermined field of view or a device that may funnel the light originating from a scene where the angle of view may be clearly determined. The present disclosure, in an instance, may contain one or a sparse array of such hybrid detectors. Further, the plasmonic hybrid device 1504, in an instance, may comprise of (but not limited to) a photodetector 2902, SiO$_2$ 2904, metal 2906 etc.

In one embodiment, An InGaAs nano-photodiode, in an instance, may be incorporated within a resonating nanoring-plasmon, which may include gold. The nanoring antenna, in an instance, may induce a resonance for any polarization of the incident light and may enhance light absorption in a thin InGaAs layer owing to its symmetric structure. Further, the simulations suggest that a carefully designed nanoring, in an instance, may achieve a quantum efficiency of more than 70% for a wide wavelength range and a maximum efficiency of about 80%.

Figure 28:
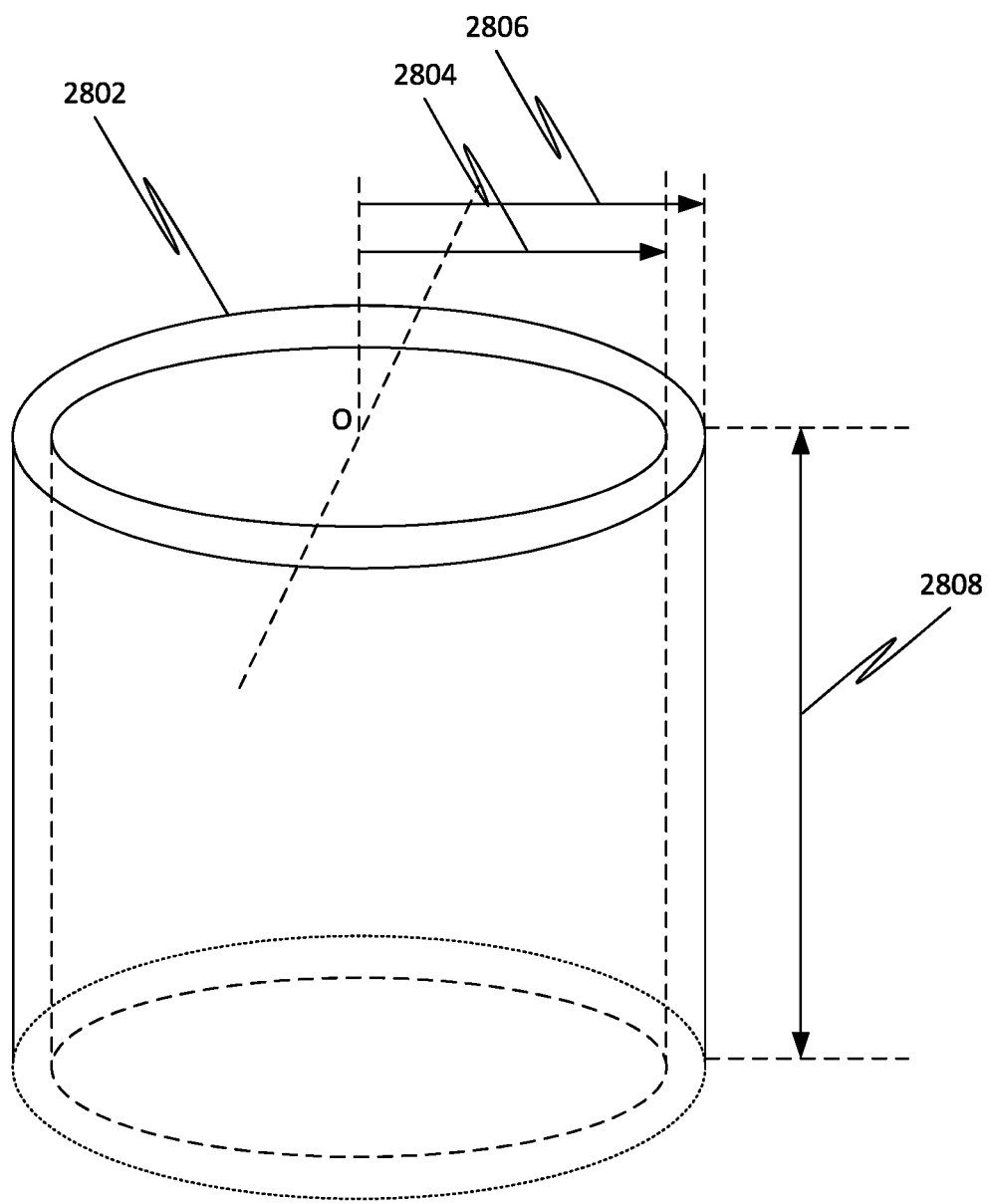
FIG. 28 shows a diagram representation of a nanoring made of gold/silver, in accordance with some embodiments.
Figure 30:
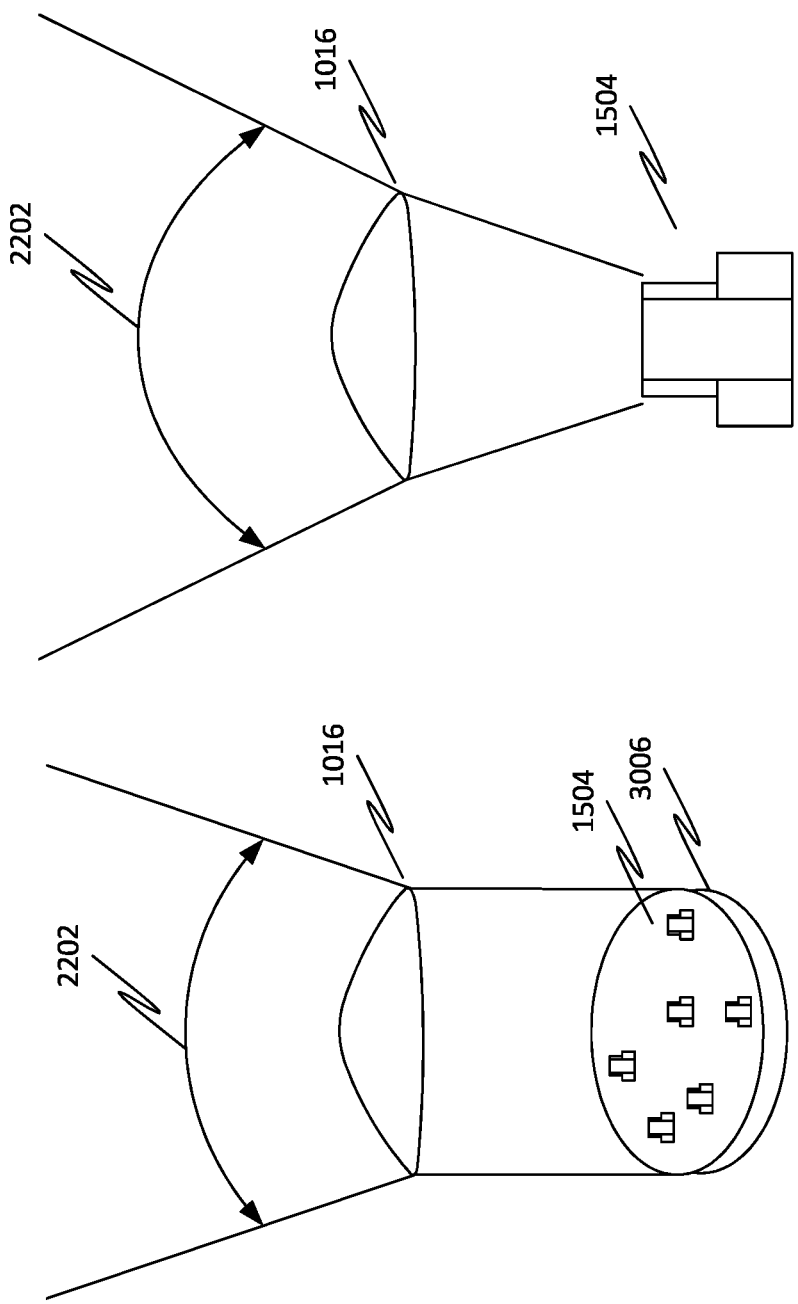
FIG. 30 illustrates an ommatidium-like plasmonic hybrid device, in accordance with some embodiments.
Figure 31:
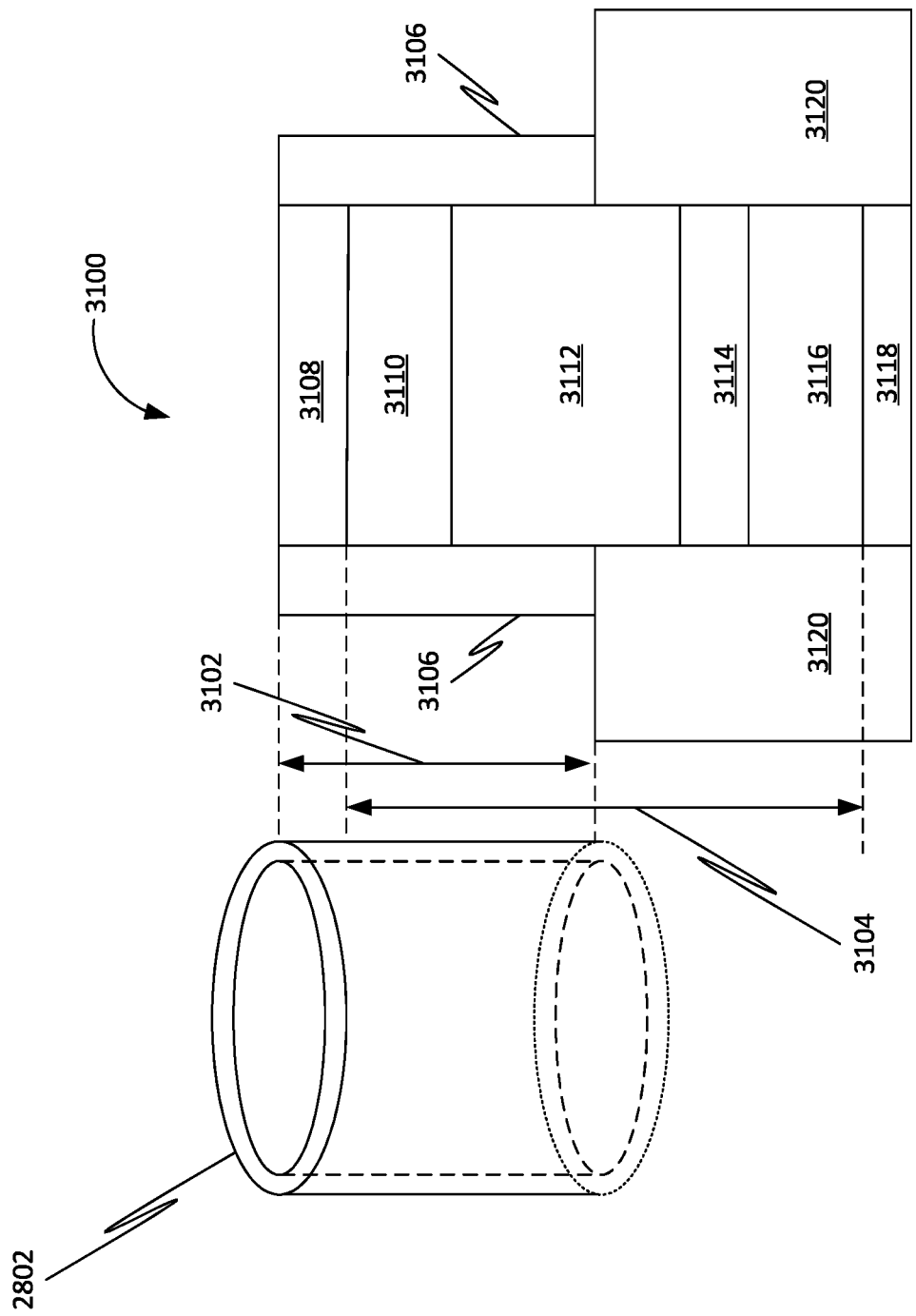
FIG. 31 illustrates an example of a plasmonic hybrid device with an InGaAs nanodiode, in accordance with some embodiments.

Further, the design of a nanoring photodetector, in an instance, may rely on many parameters, for instance, inner radius 2804 (say $R_1$), outer radius 2806 (say $R_2$), and height 2808 (say H) as shown in FIG. 28, and heights 3102 (say H) and 3104 (say $H_D$) of plasmonic hybrid device 3100 as shown in FIG. 31. Further, the plasmonic hybrid device 3100, in an instance, may comprise of (but not limited to) a nanoresonator 3106, a coating SiO$_2$ 3108, an InP cap layer 3110, an InGaAs Absorption layer 3112, an InP drift layer 3114, an InP substrate 3116, a metal contact 3118, and/or SiO$_2$ 3120. Further, a dielectric functions $\epsilon(\omega)=\epsilon_R+i\epsilon_I=n^2$, for instance for Au, and photodetector substrate 3006 (with reference to FIG. 30), for instance SiO$_2$, may be taken from the "Handbook of Optical Constants of Solids" (Academic Press, New York, 1985) by E. D. Palik. The Maxwells equations have to be solved for simulations using the boundary element method, in which the electromagnetic field may be expressed in terms of charges and currents distributed on the surfaces and interfaces of the structure under consideration. Further, the parameters, in an instance, may be optimized for different light wavelength detection. Further, by modifying the parameters, the simulations, in an instance, may show how to induce redshift or blueshift in the resonance wavelength. Further, it all may depend on the dielectric material. Further, the parameters may be redefined as, the wall thickness, $d=R_2-R_1$, and the mean radius value, $a=(R_1+R_2)/2$. Decreasing d, in an instance, may result in an increased resonance wavelength for d<<a. The corresponding excited mode may be called the dipolar symmetric mode, which may provide a strong electromagnetic coupling between the inner and outer cylinder walls and, in an instance, may be responsible for producing resonance in the near infrared spectral range. A redshift of the resonance wavelength, in an instance, may be induced by increasing the cylinder thickness that may result in increasing the interaction between the charges distributed in the lower and upper edges of a nanocylinder. The immersion of the unfilled nanocylinder into dielectric materials, in an instance, may modify the resonance wavelength in a way that higher refractive index of the medium may produce a higher redshift in the resonance wavelength. The photodetector substrate 3006 (like SiO$_2$), in an instance, may be placed underneath that may induce redshifts resulting from charges induced at the interface of the nanocylinder and the photodetector substrate 3006. Further, the simulations also clearly indicate that even a small spread in d values would give rise to a relatively large distribution of peak positions. It may be therefore likely that obtaining large resonance peak widths would be the result of an inhomogeneous broadening, due to a finite distribution of wall thickness for the measured samples.

Further, according to the simulations, there may be a strong electromagnetic coupling between the inner and outer ring walls when the thickness d may be small compared to the ring radius a. The present disclosure, in an instance, may lead to a scheme of polarization and may result in mode splitting similar to the case of a thin metallic slab, which may be characterized by symmetric and antisymmetric mode branches. In the long wavelength asymptotic limit, appropriate to the particle sizes and wavelengths under discussion, the dispersion relation of the modes of a slab may be described by the Drude-like dielectric function which reduces to equation 16 below.

$$(\omega_\pm)^2=\omega^2_p(1\pm e^{-kd})/\{(\epsilon o+\epsilon s)\pm e^{-kd}(\epsilon_o-\epsilon_s)\} \quad 16$$

Where, $\omega\pm$ corresponds to the symmetric (−) and antisymmetric (+) mode frequencies, k may be the wave vector, and d may be the slab thickness. The effect of the photodetector substrate 3006, like SiO$_2$, may be qualitatively incorporated by surrounding the plasmon with a medium of dielectric function $E_s$. In an instance, the wave vector k may be related to the ring circumference $2\pi a$ by $k=(2\pi n/2\pi a)+(n/a)$, where n may be the order of the mode. As the thickness of the walls increases, the modes converge to the surface plasmon mode of a planar surface $\omega_s=\omega_p/\sqrt{(\epsilon o+\epsilon s)}$. In one embodiment, If the wall thickness may be decreased, the symmetric may mode into redshift and may eventually go to zero for d<<a limit. This pattern of oscillation, in an instance, may correspond to a charge distribution with the same sign at the inner and outer surface of the wall. Further, symmetric n=1 mode, in an instance, may be responsible for the near-infrared excitations observed in the nanorings, and accounts for the d/a dependence evident in the experimental and theoretical simulation results. The polarization pattern of this mode, in an instance, may be understood as a strong dipolar excitation that may involve an entire ring perimeter, and where equal sign charges at opposite sides of the wall may interact to a degree determined by the wall thickness. On the contrary, the antisymmetric branches, in an instance, may correspond to patterns of oscillation of opposite sign along both walls. Further, in an embodiment, the simulations of the peak resonance position for the gold nanorings made from equation 1 by defining a=60 nm and d/a=0.1, may result in a near-infrared wavelength $\lambda$=1,110 nm.

FIG. 1 is an illustration of an online platform 100 consistent with various embodiments of the present disclosure. By way of non-limiting example, the online platform 100 to facilitate a motion sensor for three-dimensional motion analysis, supervision and control may be hosted on a centralized server 102, such as, for example, a cloud computing service. The centralized server 102 may communicate with other network entities, such as, for example, a mobile device 106 (such as a smartphone, a laptop, a tablet computer etc.), other electronic devices 110 (such as desktop computers, server computers etc.), databases 114, sensors 116, gateways 118, drones 122 and video cameras 120 over a communication network 104, such as, but not limited to, the Internet. Further, users of the online platform 100 may include relevant parties such as, but not limited to, end users, and administrators. Accordingly, in some instances, electronic devices operated by the one or more relevant parties may be in communication with the online platform 100.

A user 112, such as the one or more relevant parties, may access the online platform 100 through a web based software application or browser. The web based software application may be embodied as, for example, but not be limited to, a website, a web application, a desktop application, and a mobile application compatible with a computing device 3200.

Figure 2:
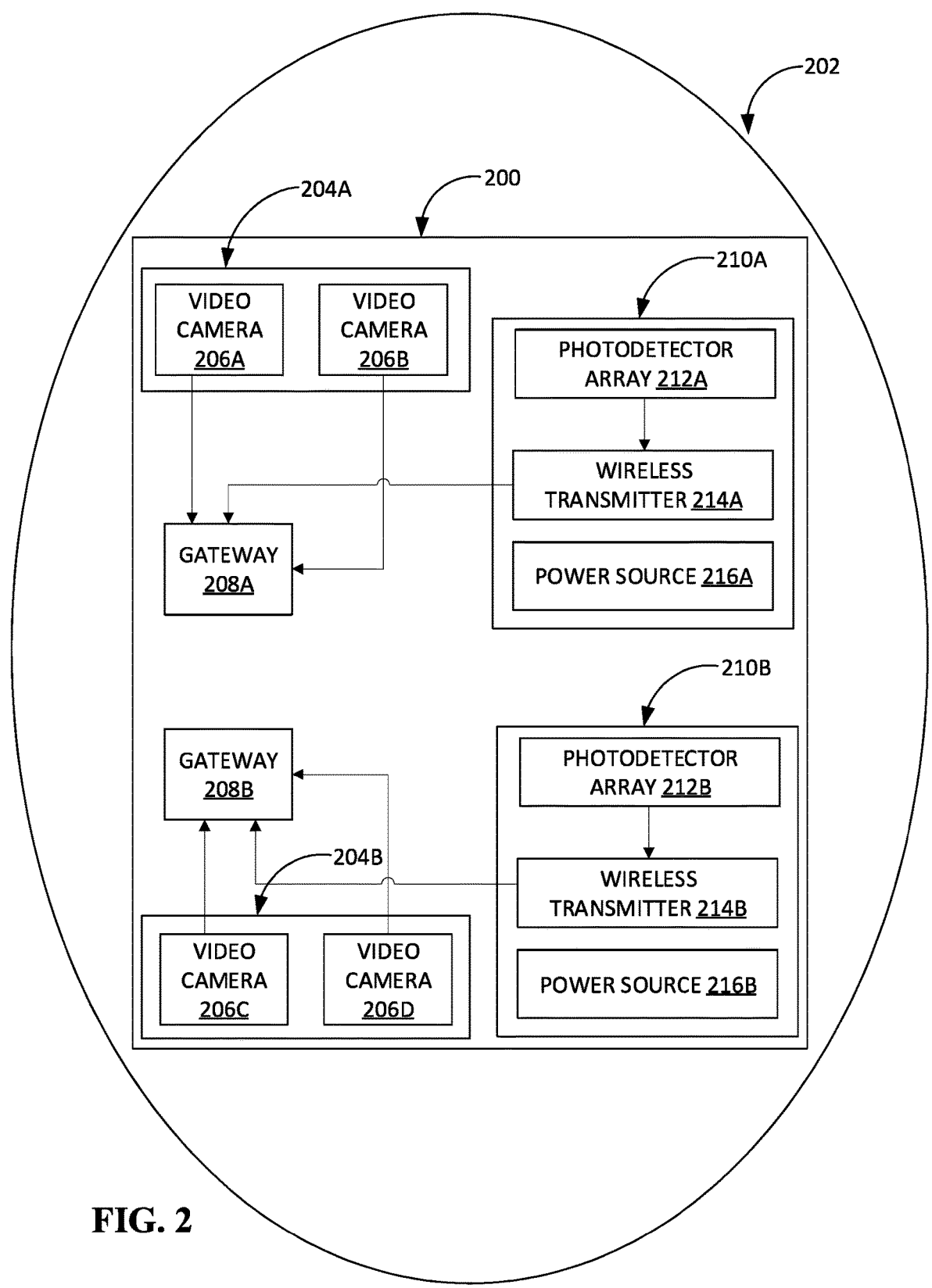
FIG. 2 illustrates a system for detecting motion corresponding to a field of interest, in accordance with some embodiments.

FIG. 2 illustrates a system 200 that may be configured to perform a motion analysis in a field of interest 202, in accordance with some embodiments. Accordingly, the motion analysis, in an instance, may be performed passively and/or actively by sensing electromagnetic and/or acoustic waves for which physical properties may have been transformed by any moving object. Further, the motion analysis, in an instance, may also include (but not limited to) a motion detection of moving patterns, a motion-oriented classification and/or selection on a detected moving pattern, an estimation of the kinematic parameter, a prediction of the kinematic parameter, a tracking to build trajectories of moving patterns of interest, a detection (and/or indication) and/or prediction of abnormalities (such as incidents, and accidents etc.), and/or a focusing on pattern of interest etc. Further, the system 200, in some embodiments, may also be detecting a motion corresponding to the field of interest 202 is disclosed. The motion, in general, may signify any change in a configuration of any physical system. The physical system, in an instance, may include, but not limited to, objects, bodies, particles of matter etc. Further, detecting the motion, in an instance, may refer to detecting a change in the kinematic properties (e.g. position, speed, velocity, acceleration etc.) of an object relative to its surroundings (and/or another object of reference). Further, detecting motion, in an instance, may also include estimation, prediction and/or tracking of kinematic parameters to build trajectories. Further, the field of interest 202 may be characterized as a three-dimensional space that may be monitored for detecting motion. Further, the field of interest 202 may include, but not limited to, commercial and business premises, residential, public and administrative buildings, parking garages, transportation stations or undergrounds, airports, private properties, city streets, and/or battle fields etc. Further, a representation of the field of interest 202, in an instance, may be installed as software in a remote monitoring center (not shown in FIG. 2) that may include a topographic representation.

Further, the system 200 may include a plurality of gateways 208 (such as gateway 208A and 208B, as illustrated in FIG. 2) disposable proximal to the field of interest 202. Further, the plurality of gateways 208, in an instance, may be configured as a two-way interface that may be capable of communicating with the remote monitoring center and/or a plurality of motion sensors 210 (such as motion sensor 210A and/or 210B as shown in FIG. 2). A gateway 208, in general, may be a communication proxy/relay used to receive a sensor data from the motion sensor 210 and/or transmit the sensor data to the remote monitoring center. Further, the gateway 208, in an instance, may be a data sink where all data may be collected from all sensors (such as the motion sensors). Further, the sensor data collected by the gateway 208, in an instance, may be concentrated/aggregated in a telecommunication network may further be transmitted to the remote monitoring center. Further, the telecommunication network, in an instance, may be a network through which the sensor data may be transmitted. The telecommunication network, in an instance, may include, but not limited to, a router, and/or a concentrator etc. Further, the router, in an instance, may be a networking device that may communicate with the motion sensor 210 and/or may forward data/message packets received from the motion sensor 210 to the telecommunication networks. Further, the concentrator, in an instance, may be a networking device that may aggregate and/or concentrate the data originating from a specific region of the field of interest 202 and/or may transmit the data to another concentrator and/or the gateway 208. Further, each gateway 208 of the plurality of gateways 208, in an instance, may include an adhesive layer or other attachment means (e.g. hook fastener, Velcro fastener, nut/bolt, magnetic fastener etc.) to enable placement of the gateway 208 in the field of interest 202. Further, the plurality of gateways 208, in an instance, may be placed within the field of interest 202. Further, the plurality of gateways 208, in an instance, may be placed near the field of interest 202. Further, the plurality of gateways 208, in an instance, may be placed at a periphery of the field of interest 202. The plurality of gateways 208, in an instance, may collect the sensor data from the plurality of motion sensors 210 (such as motion sensor 210A and 210B, as illustrated in FIG. 2) and may transmit the information by wire and/or through the internet to the remote monitoring center. Further, the remote monitoring center, in an instance, may be an online platform where the data transmitted by the gateway 208 may be received and/or processed for the motion analysis and/or for appropriate reaction/response that may be eventually displayed to an operator. Further, the remote monitoring center, in an instance, may be configured to communicate with one or more gateways 208 (such as gateway 208A and 208B, as illustrated in FIG. 2) to facilitate supervisory control and/or data acquisition for the system 200. The platform 100 may include, but not limited to, computers, laptops for analyzing data.

Further, the system 200 may include a plurality of motion sensors 210 configured to be disposed as a motion sensor network in the field of interest 202. Accordingly, the motion sensor 210, in an instance, may be sensors that may capture light/photon from the field of interest 202 and/or may transmit the sensor data to the gateway 208. Further, the motion sensor 210, in some embodiments, may be composed of a shaped array of photodetectors, a processing unit, a transmitter/receiver to gateway or router, a temporary data buffer, a power generator, a clock (with scheduler and time stamps). Optionally, the motion sensor 210, in an instance, may also contain an orientation system and/or a nanopositioning system. Further, the plurality of motion sensors 210, in an instance, may be randomly spread in the field of interest 202 forming the motion sensor network. Each motion sensor 210 of the plurality of motion sensors 210, in an instance, may include an adhesive or other attachment means (e.g. hook fastener, Velcro fastener, nut/bolt, magnetic fastener etc.) to enable placement of the motion sensor 210 in the field of interest 202. In some instances, the plurality of motion sensors 210 may be fixed on the surfaces of construction buildings and/or walls as well as on ceilings. Further, the plurality of motion sensors 210, in an instance, may be placed within the field of interest 202. Further, the plurality of motion sensors 210, in an instance, may be placed near the field of interest 202. Further, the plurality of motion sensors 210, in an instance, may be placed at a periphery of the field of interest 202.

Further, a motion sensor 210A of the plurality of motion sensors 210 may include a photodetector array 212A configured to perform photodetection. Further, the photodetector array 212A may be further configured to generate digital information representing at least one sample of the photodetection. The photodetector array 212A may include a plurality of photodetectors (not shown in the figure) positioned in an array. Accordingly, the photodetectors, in an instance, may be a structure composed of a plurality of nanosensors. Further, the photodetector, in an instance, may accumulate electrons generated by the nanosensors over a period of time until the number of electrons may be measured, usually but not necessarily, through a resulting voltage value. The number of accumulated electrons, in an instance, may be read as a digitized value that may be sampled and/or transferred to a motion sensor processor. After sampling, the electron count, in an instance, may be reset to zero. Further, the nanosensor, in an instance, may be a nano-structure unit made for photodetection that may transform incident photons into electrons. Further, the nanosensor, in an instance, may contain a microlens which may determine an angle of view and/or a spectral filter that may delimit a range of an electromagnetic spectrum that may pass through. Further, the nanosensors, in an instance, may be made of three technologies, for instance, (but not limited to) quantum dots, plasmonics compounds, and/or biomolecules/polymers. Further, the photodetectors, in an instance, may be implemented to mimic insect vision that may use thousands of individual or independent nanosensors. Further, each nanosensor, in an instance, may measure light/photon particles and convert them into electrons. The capture and conversion of a light/photon particle into an electron, in an instance, may be referred to as photodetection. In one embodiment, a voltage signal may be developed across a capacitor with the generated electrons. Further, the voltage signal, in an instance, may be converted into a digital signal by using an Analog to digital convertor. The digital signal, in general, may be a discrete time signal for which not only the time but also the amplitude has discrete values. The digital signal generated by the photodetector array 212A of the motion sensor 210A, in an instance, may be referred to as the digital information representing the sample of the photodetection.

Further, the motion sensor 210, in an instance, may include a processor that may be communicatively coupled to the photodetector array 212. The processor, in an instance, may analyze and/or process data sensed by the photodetector array 212. Further, the data analyzed and/or processed by the processing device, in an instance, may be transmitted to the gateway 208 through a wireless transmitter 214.

Further, the motion sensor 210A may include a wireless transmitter 214A communicatively coupled to the processor. Further, the wireless transmitter 214A may be configured to transmit the digital information to at least one the motion sensor 210A of the plurality of motion sensors 210 and/or the at least one gateway 208A of the plurality of gateways 208 (such as gateway 208A and 208B, as illustrated in FIG. 2). Further, the wireless transmitter 214, in general, may be defined as an electronic device that may produce electromagnetic waves with an antenna for transmitting a data. The wireless transmitter 214A, in an instance, may be communicatively coupled with the processor through a wired connection. The wired connection, in an instance, may be of a size of nanometer/micrometer in order to accommodate within the motion sensor 210A. The wired connection, in an instance, may have high conductivity or low resistivity to transmit the digital information with minimum attenuation. Further, the wired connection, in an instance, may be made up of materials such as, but not limited to, silver, copper, aluminum, or gold etc. The digital information from the processor, in an instance, may be received by the wireless transmitter 214A through the wired connection. The wireless transmitter 214A of the motion sensor 210A, in an instance, may then transmit the digital information to the gateway 208A. In one embodiment, the digital information may include an address and/or a timestamp of the motion sensor 210 that may be sending the digital information to the gateway 208. In another embodiment, the motion sensor 210A, in an instance, may transmit the digital information simultaneously to three or more gateways 208 through the wireless transmitter 214A in order to perform a triangulation. Further, the triangulation, in an instance, may be used to determine a location of the motion sensor 210A.

Further, the motion sensor 210A may include a power source 216A configured to provide electrical energy to the processor and/or the wireless transmitter 214A. The power source 216, in general, may be defined as a component that may supply electrical energy to at least one electronic element of a circuit. The power source 216A, in an instance, may include Nano-batteries to provide electrical energy to the wireless transmitter 214A. Further, the electrical energy stored by the power source 216A, in an instance, may be supplied to the wireless transmitter 214A through an electric cable. The electric cable, in an instance, may have high conductivity or low resistivity to supply the electrical energy with minimum losses. Further, the electric cable, in an instance, may be made up of materials such as, but not limited to, silver, copper, aluminum, or gold etc. In one embodiment, the motion sensor 210 may include a Nano-power generation or a lifetime energy harvesting system to provide electrical energy to the wireless transmitter 214A. The Nano-power generation or the lifetime energy harvesting system, in an instance, may use the light/photon energy from a surrounding of the motion sensor 210. The light/photon energy, in an instance, may be converted into the electrical energy that may be given to the wireless transmitter 214A.

Further, the system 200 may include a plurality of video cameras 206 (such as video camera 206A, 206B, 206C and 206D, as illustrated in FIG. 2) disposable at a plurality of key locations 204 (such as key location 204A and 204B, as illustrated in FIG. 2) in the field of interest 202. Further, each video camera 206 may be configured to capture an image sequence associated with a portion of the field of interest 202. Further, each video camera 206 may be further configured to transmit a part of a corresponding image sequence to one or more of the remote monitoring centers through the at least one gateway 208A of the plurality of gateways 208. The key location 204A, in an instance, may be a location that may be crucial for moving target recognition and classification. In a typical civilian application, the key location 204A at which the video camera 206A and 206B may be disposed may include, but not limited to, street poles, side walls, ceilings etc. Each video camera 206 of the plurality of video cameras 206, in an instance, may include an optical lens (not shown in the figure). The optical lens, in an instance, may concentrate a light to a focal point on an array of photodetectors (not shown in the figure). The array of photodetectors, in an instance, may collectively receive a high-resolution focused image sequence of a scene from the key location 204A. The high-resolution focused image sequences of the scene from the key location 204A, in an instance, may be transmitted to one or more of the remote monitoring center and the plurality of gateways 208 through a transmitter (not shown in the figure). The transmitter, in an instance, may transmit the high-resolution focused image over, but not limited to, a Wi-Fi, a Bluetooth, an Infra-red, or a wired communication channel. The plurality of video cameras 206, in an instance, may provide the system 200 high-resolution image sequences of the key locations 204A and 204B associated with the field of interest 202. In one embodiment, some drones may be equipped with the plurality of video cameras 206 having the capability to move and to focus on targets of interest.

Figure 3:
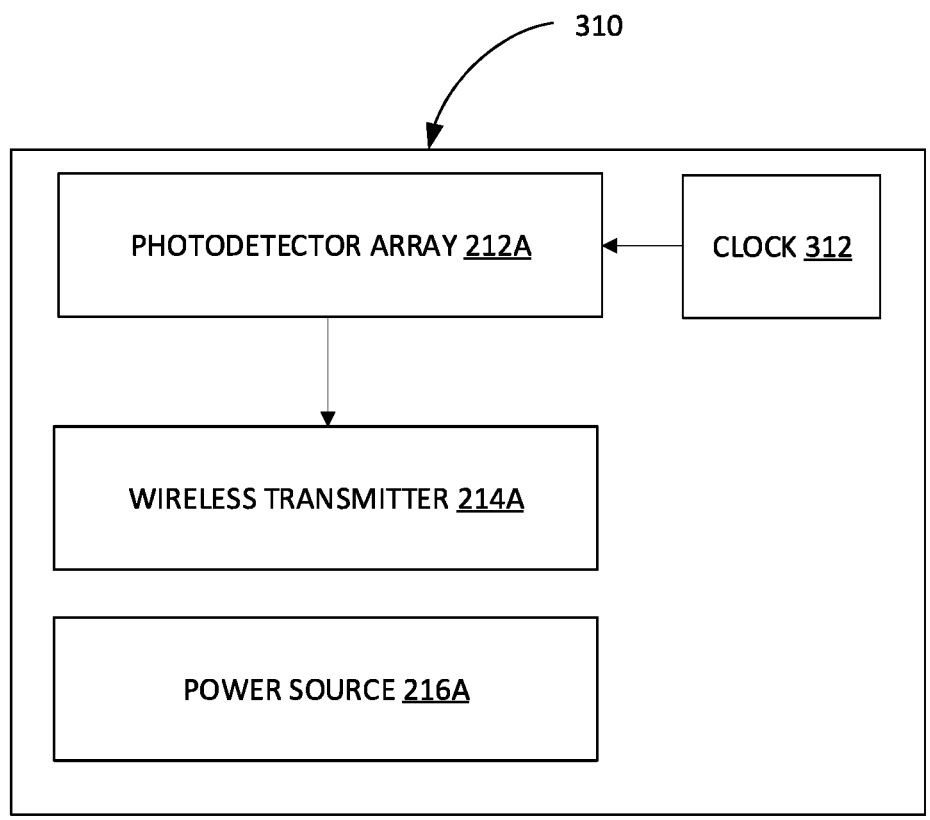
FIG. 3 illustrates a block diagram representation of a motion sensor including a clock, in accordance with some embodiments.

FIG. 3 shows a block diagram representation of a motion sensor 310 including a clock 312, in accordance with some embodiment. In some embodiments, the motion sensor 310 further may include a clock 312 configured to generate a periodic signal. Further, the clock 312 may be communicatively coupled to the processor. Further, the processor, in an instance, may be configured to sequence sampling of photodetector measurements and/or to generate the timestamps based on the periodic signal. Further, the digital information further represents the at least one timestamp corresponding to the at least one sample. The clock 312, in an instance, may be signal generator configured to generate the periodic signal. The periodic signal, in general, may be characterized as a signal that may repeat itself over identical subsequent periods. The periodic signal may be, but not limited to, a square wave, a triangular wave, a sinusoidal wave etc. The clock 312, in an instance, may be communicatively coupled with the photodetector array 212A through a wired connection. The wired connection, in an instance, may be of a size of nanometer/micrometer in order to accommodate within the motion sensor 310. The wired connection, in an instance, may have high conductivity or low resistivity to transmit the periodic signal with minimum attenuation. Further, the wired connection, in an instance, may be made up of materials such as, but not limited to, silver, copper, aluminum, or gold etc. A timestamp, in general, may be characterized as a sequence of characters or encoded information representing date and/or time of a certain event. The timestamp, in an instance, may be generated by the photodetector array 212A based on the periodic signal by the clock 312.

Figure 4:
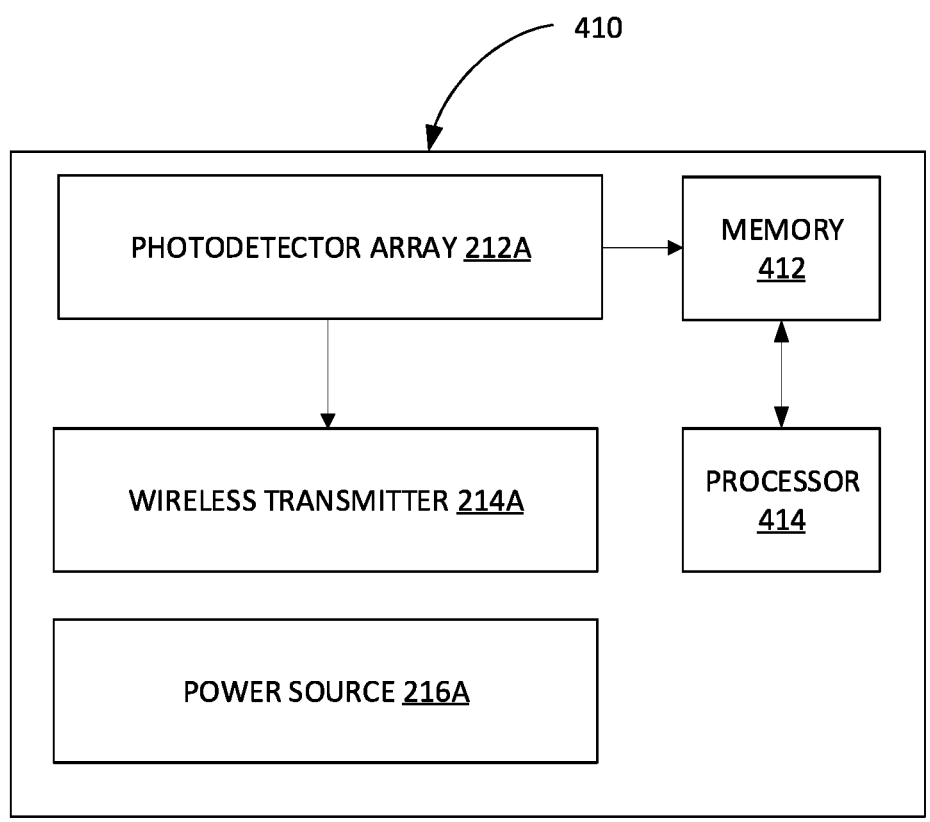
FIG. 4 illustrates a block diagram representation of a motion sensor including a memory and a processor, in accordance with some embodiments.

FIG. 4 illustrates a block diagram representation of a motion sensor 410 including a memory 412 and/or a processor 414. Accordingly, in some embodiments, the motion sensor 410 may include a memory 412 communicatively coupled to the processor 414. Further, the memory 412 may be configured as a buffer to temporarily store the digital information and/or a control information received from the remote monitoring center. The memory 412, in general, may be a physical device capable of storing information temporarily or permanently. The memory 412, in an instance, may include, but not limited to, a hard disk, a RAM, an optical disk drive, and/or an externally connected USB drive etc. Further, the processor 414, in an instance, may generate the digital information composed of sampled measurements from the photons/light received by the photodetector array 212A. The digital information, in an instance, may be transferred from the processor 414 to the memory 412 by using a communication bus. The communication bus, in an instance, may include parallel electrical wires for data transfer. The motion sensor 410, in an instance, may store the digital information in the memory 412 before transmitting the digital information to the gateway 208A through the wireless transmitter 214A. Further, the processor 414, in an instance, may be configured to process the digital information. The processor 414, in an instance, may carry out a computer program by performing arithmetical, logical, control operations for analyzing the digital information. The processor 414, in an instance, may communicate with the memory 412 by using the communication bus to access the digital information before processing. The processor 414, in an instance, may include, but not limited to, an arithmetic logical unit, a plurality of registers, an accumulator etc. for a processing of the digital information. The processing of the digital information, in an instance, may include manipulation of data to produce a meaningful information. Further, the control information, in an instance, may comprise of an identification number, a photodetection intensity threshold to trigger reaction, a sampling period, a maximal period before transmitting updates and/or photodetector summation patterns. Further, the processor 414, in an instance, may further be configured to process the digital information and the control information, to generate timestamps, to trigger the photodetection sampling and/or the wireless communications.

In some embodiments, the system 200 may further include a plurality of detectors configured to be disposed in the field of interest 202. Further, each detector may be configured to detect one or more of acoustic energy, microwave energy, displacement, speed, velocity, a dangerous, radioactive energy, a chemical, a metal, and a mineral. The detector, in general, may be an electric transducer that may convert one form of energy to an electrical signal. Each detector of the plurality of detectors, in an instance, may include an adhesive or other attachment means (e.g. hook fastener, Velcro fastener, nut/bolt, magnetic fastener etc.) to enable placement of the detector in the field of interest 202. Further, the plurality of detectors, in an instance, may be placed within the field of interest 202. Further, the plurality of detectors, in an instance, may be placed near the field of interest 202. Further, the plurality of detectors, in an instance, may be placed at a periphery of the field of interest 202. In one embodiment, the system 200 may include an acoustic detector for detecting the motion in a gas plant. The acoustic detector, in an instance, may hear a gas leak by analyzing a distinct ultrasound emitted by a pressurized gas leak across the widest spectrum of frequencies. The acoustic detector, in an instance, may transmit the digital information to the gateway 208A through the wireless transmitter 214A.

Figure 5:
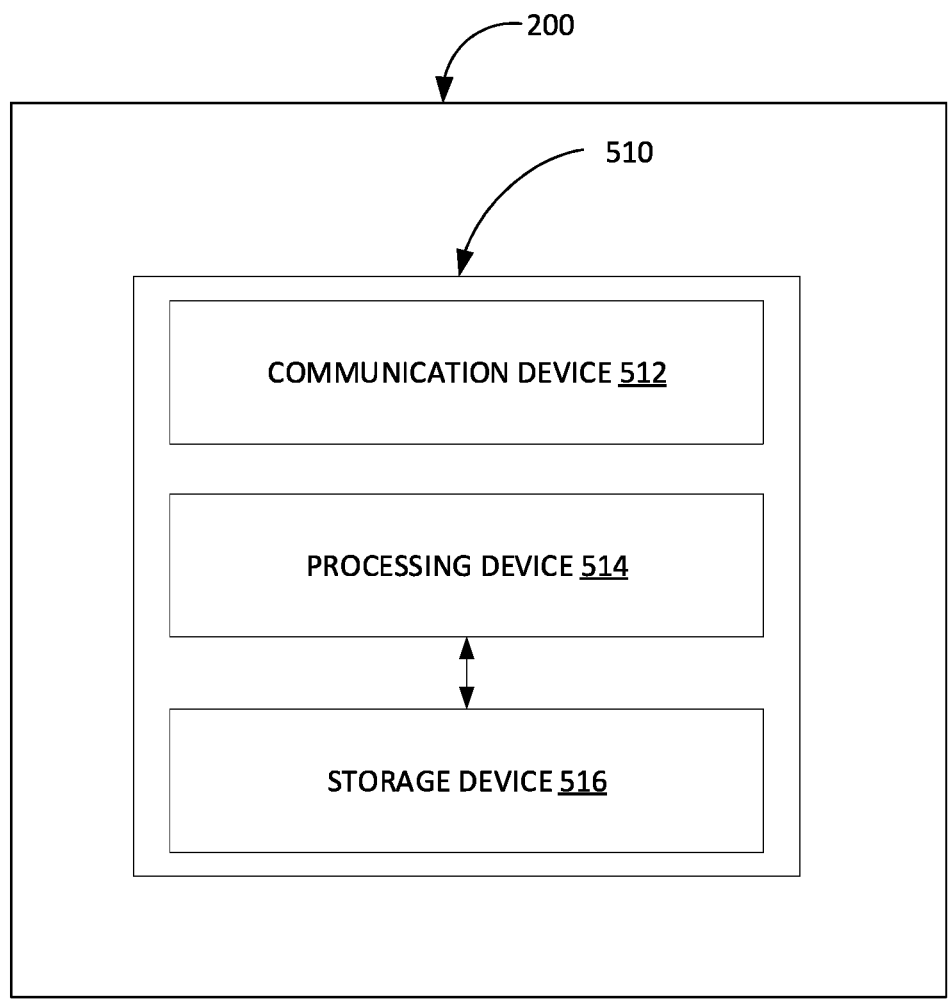
FIG. 5 illustrates a block diagram representation of a system comprising of a remote monitoring center for detecting motion corresponding to a field of interest, in accordance with some embodiments.

FIG. 5 illustrates a block diagram representation of a system 200 comprising of a remote monitoring center 510 for detecting motion corresponding to a field of interest 202. Accordingly, the remote monitoring center 510 may include a communication device 512 configured to communicate with the one or more plurality of gateways 208 and/or the plurality of video cameras 206. Further, the plurality of the video cameras 206, in an instance, may be located on at least one of a robot and/or a drone. Further, the communication device 512, in general, may be a hardware device capable of transmitting an Analog and/or digital signal over wired or wireless communication medium. The communication device 512, in an instance, may include, but not limited to, a modem, a transmitter, a receiver, a Wi-Fi device, a Bluetooth device, an infrared device etc. to carry out communication with the plurality of gateways 208 and/or with the plurality of video cameras 206.

Further, the remote monitoring center 510 may include a processing device 514 based on artificial intelligence configured to perform motion analysis and/or moving pattern recognition in real-time based on one or more of the digital information and the image sequences. Further, the processing device 514, in an instance, may carry out a computer program by performing arithmetic, logical, and/or control operations for motion analysis. Further, the motion analysis, in an instance, may be based on a digital data captured from the plurality of video cameras 206 and/or from the plurality of gateways 208 disposed in the field of interest 202. Further, the motion analysis, in an instance, may not only mean motion detection, moving target classification and/or recognition but also estimation, prediction and tracking of kinematic parameters (e.g. position, speed, velocity, acceleration etc.) to build trajectories. Moving target detection and recognition, in an instance, may include a selection through scale and orientation. Further, the motion analysis, in an instance, may also include a motion detection of moving patterns, a motion-oriented classification and/or selection on a detected moving pattern, an estimation of the kinematic parameter, a prediction of the kinematic parameter, a tracking to build trajectories of moving patterns of interest, a detection (and/or indication) and/or prediction of abnormalities (such as incidents, and accidents etc.), and/or a focusing on pattern of interest etc.

Further, the remote monitoring center 510 may include a storage device 516 configured to store one or more of the digital information results of the motion analysis and moving pattern recognition. The storage device 516, in general, may be defined as a hardware device used for storing, porting, and/or extracting data files and/or information. Further, the storage device 516, in an instance, may be referred to as a big data storage device. Further, the storage device 516, in an instance, may include, but not limited to, a hard disk, a RAM, an optical disk drive, and/or an externally connected USB drive etc. Further, the storage device 516, in an instance, may include a plurality of registers that may store the digital information, the image and/or the result of the motion analysis in a binary form. The plurality of registers, in an instance, may hold a binary number of, but not limited to, 8 bits, 12 bits, 16 bits or 32 bits. Further, the result of the motion analysis, in an instance, may include an image that may signify a change in configuration of the system 200.

Further, in some embodiments, the plurality of motion sensors 210 (such as motion sensor 210A and 210B, as illustrated in FIG. 2) may be configured to be disposed on at least one of a part and/or an entirety of an infrastructure. The motion sensors 210, in an instance, may be constructed with a shape to facilitate the motion sensor 210 to be fixed on the least one of the part and/or the entirety of the infrastructure in the field of interest 202. Further, the infrastructure, in an instance, may include, but not limited to, surfaces of construction buildings and/or walls, ceilings etc. In one embodiment, the motion sensors 210 may be constructed with a semilunar shape. The semilunar shape of the motion sensor 210, in an instance, may include a convex surface and a flat surface. The convex surface, in an instance, may be covered with the photodetector array 212. The flat surface, in an instance, may provide attachment to an existing (concrete) structure like a wall and/or a ceiling. Further, the flat surface, in an instance, may include an adhesive or other attachment means (e.g. hook fastener, Velcro fastener, nut/bolt, magnetic fastener etc.) to enable placement of the motion sensor 210 in the field of interest 202.

In some embodiments, the plurality of motion sensors 210 (such as motion sensor 210A and 210B, as illustrated in FIG. 2) may include an individual adhesive layer configured to adhere to a portion of the infrastructure. Further, the plurality of motion sensors 210, in an instance, may be characterized by at least one of a semilunar and/or a flat shape configured to adhere on a surface and/or an oblong spherical shape configured not to adhere on any surface in the field of interest 202. The semilunar shape of the motion sensors 210, in an instance, may include a flat surface with the adhesive layer or other attachment means (e.g. hook fastener, Velcro fastener, nut/bolt, magnetic fastener etc.) to facilitate the motion sensors 210 to be fixed on the portion of the infrastructure. The adhesive layer, in an instance, may include, but not limited to, an epoxy, a cyanoacrylate etc.

Figure 6:
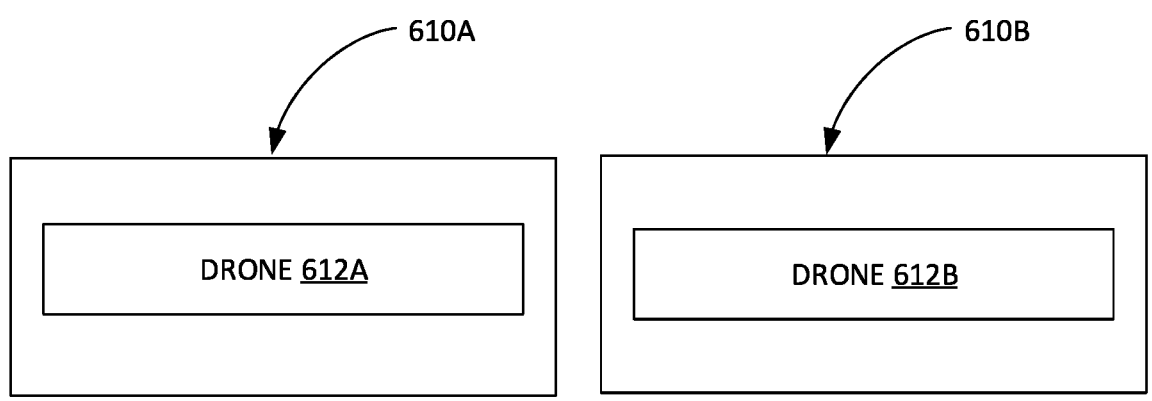
FIG. 6 illustrates a block diagram representation of a gateway including at least one drone, in accordance with some embodiments.

FIG. 6 illustrates a block diagram representation of at least one gateway 610 including at least one drone 612 capable of flight over the field of interest 202 and/or at least one robot capable of movement in the field of interest 202. In some embodiments, the plurality of gateways 610 (such as gateway 610A and 610B, as illustrated in FIG. 6) may include at least one drone 612 (such as drone 612A and 612B, illustrated in FIG. 6) capable of flight. A drone 612, in general, may be characterized as an unmanned aerial vehicle and/or an aircraft piloted by a remote control and/or an on-board computer. The gateway 710 comprising of at least one drone 612, in an instance, may enable mobility of the gateway 710 across the field of interest 202. The drone 612A, in an instance, may collect data from the plurality of motion sensors 210 and/or may collect images from the plurality of video cameras 206. The drone 612A, in an instance, may transmit a data collected from the plurality of the nanosensors 210 and/or from the plurality of the video cameras 206 to the remote monitoring center 510 (as shown in FIG. 5). Further, the drone 612A, in an instance, may have the ability to move and/or to focus cameras on the field of interest 202.

Figure 7:
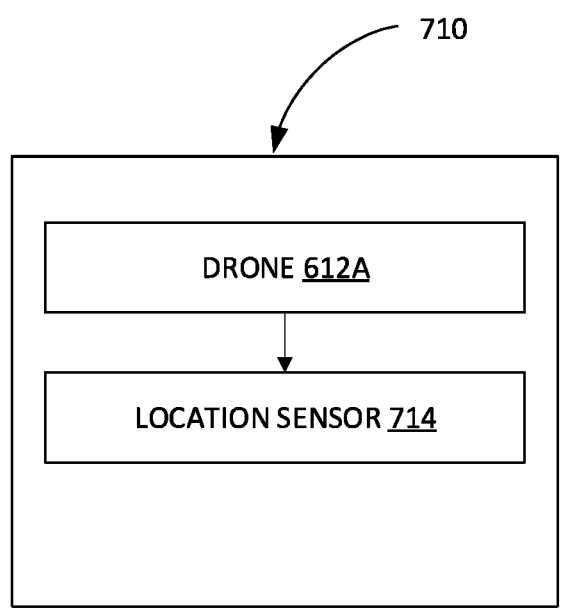
FIG. 7 illustrates a block diagram representation of a gateway including a drone and a location sensor, in accordance with some embodiments.

FIG. 7 illustrates a block diagram representation of a gateway 710 including a drone 612A and/or a location sensor 714 configured to determine a geographical location of at least one of the at least one drone 612A and the at least one robot, wherein at least one of the at least one drone 612A and/or the at least one robot may be configured to transmit the geographical location to the remote monitoring center 510. In some embodiments, the plurality of gateways 610 (such as gateway 610A and 610B, as illustrated in FIG. 6)

may further include a location sensor 714 configured to determine a geographical location of the at least one drone 612A and/or the at least one robot. Further, the at least one drone 612A and/or the at least one robot may be configured to transmit the geographical location to the remote monitoring center 510. The location sensor 714, in an instance, may be a GPS sensor that may sense latitude and longitude coordinates of a physical device. The physical device, in an instance, may include, but not limited to, the drones 612, the gateways 208, the motion sensors 210, and/or the at least one robot etc. Further, in one embodiment, the drone 612A and/or the at least one robot may be used for locating the position of the motion sensors 210 in the field of interest 202 by triangulation and use of their own GPS information. The triangulation, in an instance, may be referred to as tracing and measurement of a network of triangles in order to determine the geographical location of the motion sensors 210 spread over the field of interest 202. In one embodiment, the at least three drones 612 may receive a sensor data from the motion sensor 210A to perform the triangulation. Further, in another embodiment, at least one drone 612A may receive the sensor data from the motion sensor 210A at different times occupying different positions to perform triangulation. Further, the drone 612A and/or the at least one robot, in an instance, may transmit/receive the sensor data by using a wireless transmitter-receiver. The wireless transmitter-receiver, in an instance, may transmit/receive the sensor data over, but not limited to, a Wi-Fi, a Bluetooth, an Infra-red, or a wired communication channel.

Figure 8:
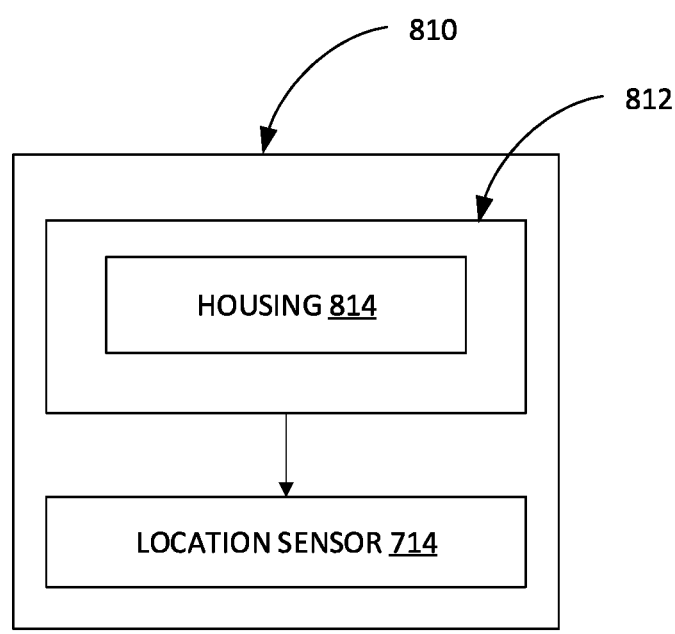
FIG. 8 illustrates a block diagram representation of a gateway including a drone that may further include a housing to accommodate one or more of the plurality of motion sensors, in accordance with some embodiments.

FIG. 8 illustrates a block diagram representation of a gateway 810 including at least one drone 812 and/or the at least one robot that may further include a housing 814 to accommodate one or more of the plurality of motion sensors 210 and/or at least one video camera 206A of the plurality of video cameras 206. Accordingly, in some embodiments, the at least one drone 812 further may include the housing 814 configured to accommodate one or more of the plurality of motion sensors 210 (such as motion sensor 210A and 210B, as illustrated in FIG. 2). Further, the at least one drone 812 may be further configured to dispose the one or more of the plurality of motion sensors 210 proximal to the field of interest 202. The drone 812, in an instance, may include motion sensor 210A in the housing 814 for detecting motion over the field of interest 202. The housing 814, in an instance, may be vacant space situated within the drone 812 to accommodate the motion sensor 210A. Further, the motion sensor 210A, in an instance, may be detached from the housing 814 of the drone 812 in order to be disposed in a desired location within the field of interest 202. The desired location, in an instance, may be difficult or uneconomical to reach by a person. For instance, the desired location may include, but not limited to, a militarized zone, a construction site, an isolated cave etc.

In some embodiments, the at least one drone 812 may be configured to simultaneously dispose the plurality of motion sensors 210. The drone 812, in an instance, may include the plurality of motion sensors 210 for detecting motion over the field of interest 202. The plurality of motion sensors 210, in an instance, may be detached from the drone 812 in order to be disposed in a desired location. The disposing of the plurality of motion sensors 210, in an instance, may include a simultaneous dropping of the plurality of motion sensors 210 or simultaneous propelling (e.g. ejecting) of the plurality of motion sensors 210. The plurality of motion sensors 210 (such as motion sensor 210A and 210B, as illustrated in FIG. 2), in an instance, may be scattered within the field of interest 202 without any particular pattern or order. The field of interest 202, in an instance, may be an open field and the motion sensors 210 may be scattered randomly.

Figure 9:
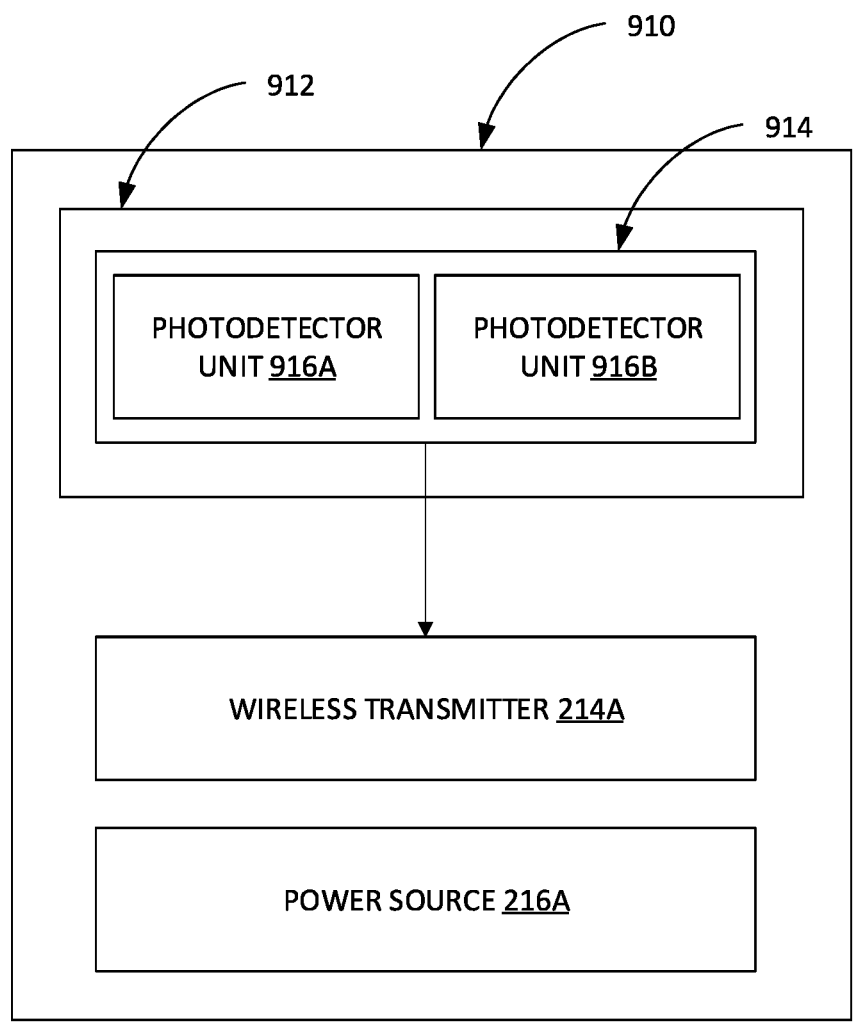
FIG. 9 illustrates a block diagram representation of a motion sensor including an interior surface and a posterior surface, in accordance with some embodiments.

FIG. 9 illustrates a block diagram representation of a motion sensor 910 including an interior surface 912 and a posterior surface (not shown in the figure). Accordingly, in some embodiments, the motion sensor 910 may include an anterior surface 912 and a posterior surface. Further, the photodetector array 914 may include a plurality of photodetector units 916 (such as photodetector unit 916A and 916B, as illustrated in FIG. 9) disposed over the anterior surface 912. Further, the anterior surface 912, in an instance, may form at least one of a convex shape and/or a planar shape. Further, the posterior surface, in an instance, may be configured to be attached to a portion of at least one of an infrastructure and/or a common supporting frame. The motion sensor 910, in an instance, may be constructed with a semilunar or an oval/spherical shape. The interior surface 912 of both the semilunar and the oval/spherical shaped motion sensors 910, in an instance, may be the convex surface. The convex surface, in an instance, may be covered with the plurality of photodetector units 916 (such as photodetector unit 916A and 916B, as illustrated in FIG. 9). The posterior surface, in an instance, may be a flat surface. The flat surface, in an instance, may provide attachment to an existing (concrete) structure like a wall and/or a ceiling. Further, the flat surface, in an instance, may include an adhesive or other attachment means (e.g. hook fastener, Velcro fastener, nut/bolt, magnetic fastener etc.) to enable placement of the motion sensor 910 in the field of interest 202.

Figure 10:
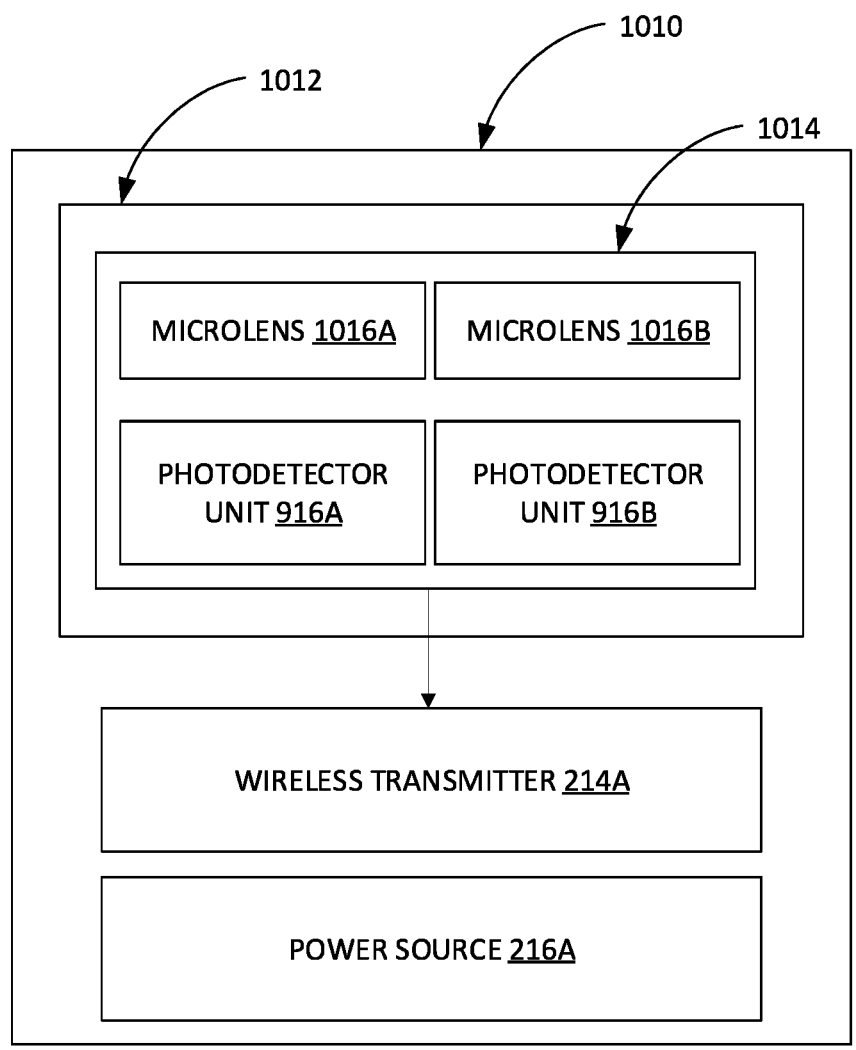
FIG. 10 illustrates a block diagram representation of a motion sensor including a plurality of microlenses, in accordance with some embodiments.

FIG. 10 illustrates a block diagram representation of a motion sensor 1010 including a plurality of microlenses 1016. Accordingly, in some embodiments, the motion sensor 1010 may include a plurality of microlenses 1016 (such as microlens 1016A and 1016B, as illustrated in FIG. 10) corresponding to the plurality of photodetector units 916 (such as photodetector unit 916A and 916B, as illustrated in FIG. 10). Further, a microlens 1016A corresponding to a photodetector unit 916A may be configured to funnel the light emanating from a portion of the field of interest 202 onto the photodetector unit 916A. Further, the portion of the field of interest 202, in an instance, may be designed as a limited angle of view determining a cone of visibility. Further, the microlens 1016, in general, may be characterized as a small lens that may converge or diverge a light beam by means of refraction. The plurality of microlenses 1016, in an instance, may mimic an insect vision. Each microlens 1016 of the plurality of microlenses 1016, in an instance, may be independent and arranged in a bundle of individual units. The light beam from a portion of the field of interest 202, in an instance, may be directed by the microlens 1016A onto the photodetector unit 916A. The photodetector unit 916A, in an instance, may be fabricated with different technologies involving, but not limited to, CMOS detectors, quantum dots, or hybrid devices using surface plasmons as resonator etc.

Figure 11:
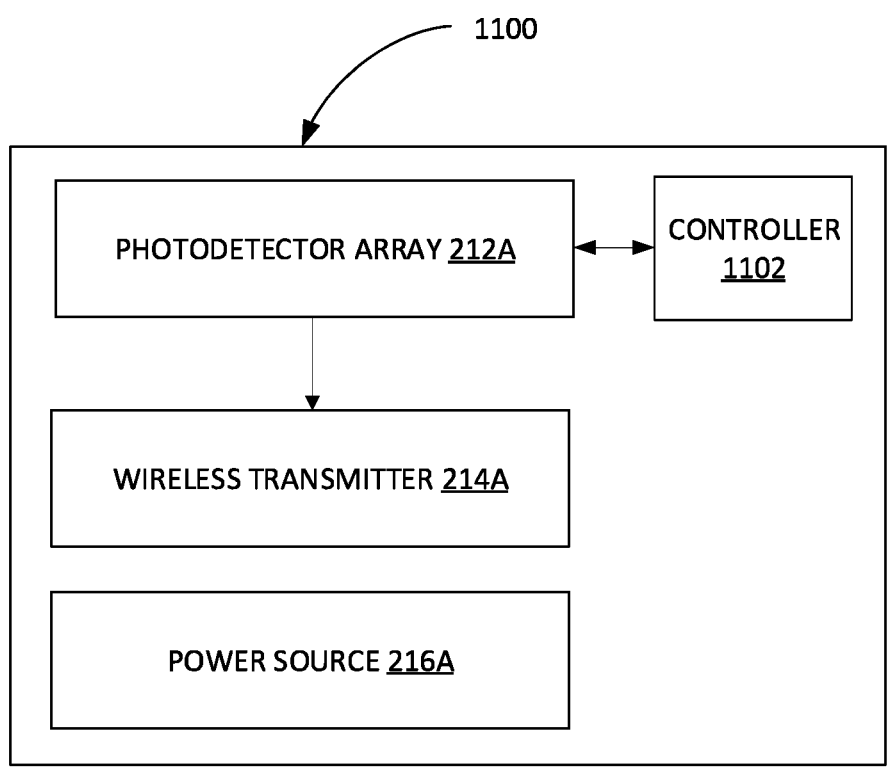
FIG. 11 illustrates a block diagram representation of a motion sensor including a controller, in accordance with some embodiments.

FIG. 11 illustrates a block diagram representation of a motion sensor 1100 including a controller 1102. Accordingly, in some embodiments, the motion sensor 1100 further may include a controller 1102 communicatively coupled to the photodetector array 212A. The controller 1102, in an instance, may include sensors and processors for detecting and performing the motion analysis based on the photodetection. Further, the controller 1102 may be configured to detect an ambient luminosity level based on the photodetection. The ambient luminosity level, in an instance, may be an illumination level present in the surroundings of the motion sensor 210 in the field of interest 202. The illumination level, in an instance, may be measured in lux. For instance, a typical illumination level of daylight without direct sunlight may have the ambient luminosity level of 10,000 lux. The controller 1102, in an instance, may include a lux sensor for sensing the ambient luminosity level.

Further, in one embodiment, the controller 1102 may be configured to perform a spatial summation of signals generated by at least two of the plurality of photodetector units 916 based on the ambient luminosity level. The spatial summation of signals, in an instance, may be an algebraic sum of the signals from the plurality of photodetector units 916. The controller 1102, in an instance, may link together a number of neighboring photodetectors to create additivity. The controller 1102, in an instance, may increase the number of neighboring photodetectors to be grouped for the spatial summation at the low ambient luminosity level. The spatial summation of signals, in an instance, may result in a brighter image for the low ambient luminosity level. The controller 1102, in an instance, may also make the microlens 1016 wider to absorb more photons/light by the photodetector for the low ambient luminosity level.

Further, in another embodiment, the controller 1102 may be configured to set a sampling frequency associated with the photodetector array 212A based on the ambient luminosity level. Further, the photodetector array 212A may be configured to generate the at least one sample in accordance with the sampling frequency. The sampling frequency, in an instance, may be defined as a rate at which a sample may be generated based on the photodetection. The sampling frequency, in an instance, may be reduced by the controller 1102 in order to capture more number of photons in the low ambient luminosity level.

Further, in some embodiments, the plurality of photodetectors in the photodetector array 212A, in an instance, may be configured to perform at least one of an increase in optical sensitivity and an increase in radiance detection based on at least one factor selected from a group. Further, the factor, in an instance, may include, but not limited to, an area of an optical microlens, a field of view of the optical microlens, an integration time between two consecutive sampling times, and/or a spatial summation obtained by clustering neighboring photodetectors.

Further, in some embodiments, the photodetector in the photodetectors array 212A, in an instance, may be configured to deliver, at the sampling time triggered by the processor, a digital number based on the number of photons captured during the period of time starting at the previous sampling time.

Further, in some embodiments, the motion sensor, in an instance, may include a processor communicatively coupled to the photodetector array 212A. Further, the processor, in an instance, may be configured to detect a change of radiant intensity in the field of view of each photodetector in the photodetector array 212A by sampling the array and/or collecting the measurements or samples with a given rate (such as typically ranging from 10 millisecond to one or a few seconds) determined either locally by the local intensity of ambient light or remotely by a request from the remote monitoring center 510.

Further, the processor, in an instance, may be configured to perform spatial summation of samples generated by at least two of the plurality of photodetector units 916 with a number and a pattern determined either locally by the local intensity of ambient light or remotely by a request from the remote monitoring center 510.

Further, in some embodiments, the motion sensor 1100, in an instance, may include a processor communicatively coupled to the photodetector array 212A. Accordingly, the processor, in an instance, may be configured to send a message to the remote monitoring center 510 when a change of contrast or of incoming radiant intensity may be detected in one or more photodetector at sampling time. Further, the photodetector, in an instance, may be configured to generate the at least one sample in accordance with the sampling frequency. Further, a threshold for detecting a change of intensity, in an instance, may be determined locally by the processor and/or remotely by the remote monitoring center 510. Further, the message, in an instance, may be composed at least of an updated sampling measurement holding on 8 to 12 bits and/or issued from the photodetectors, the corresponding time stamp and a motion sensor identifier.

Figure 12:
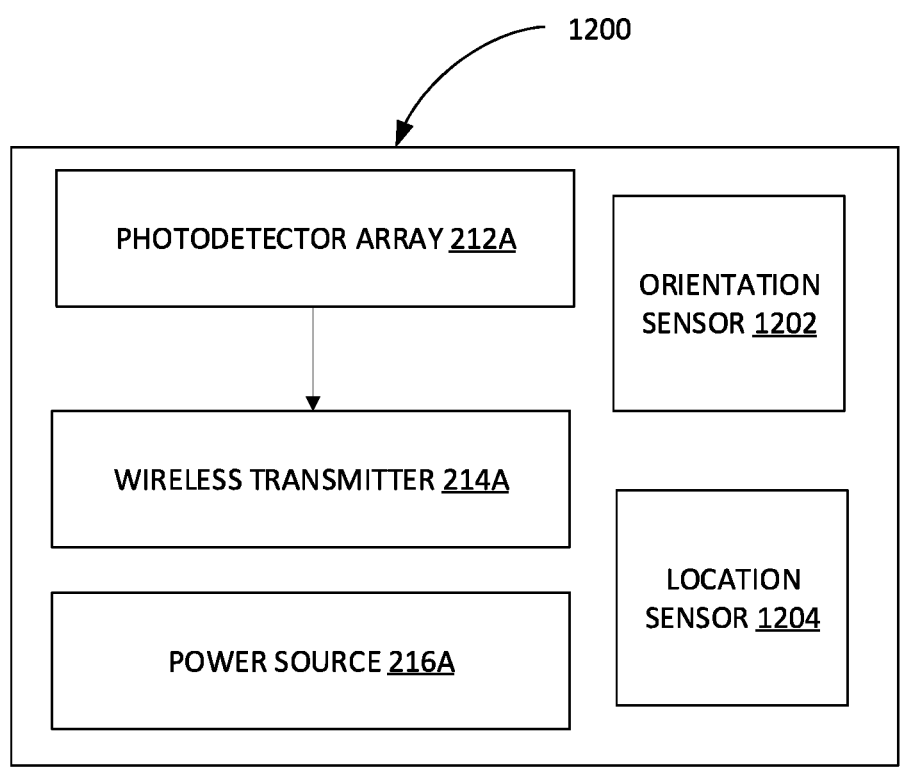
FIG. 12 illustrates a block diagram representation of a motion sensor including an orientation sensor and a location sensor, in accordance with some embodiments.

FIG. 12 illustrates a block diagram representation of a motion sensor 1200 including an orientation sensor 1202 and a location sensor 1204. Accordingly, in some embodiments, the motion sensor 1200 may include one or more of an orientation sensor 1202 and a location sensor 1204. Further, the motion sensor 1200 may include a hardware system and/or a software with protocol to sense orientation and/or location of the motion sensor 1200. Further, the orientation, in an instance, may be given by a stereoscopic vector orthogonal to the plane of the photodetector array 212A. Further, the location, in an instance, may be given by the coordinates of the motion sensor 1202 within the field of interest 202. Further, the orientation sensor 1202 may be configured to detect an orientation of the motion sensor 1200 in relation to the field of interest 202. Further, the location sensor 1204 may be configured to detect a location of the motion sensor 1200 within the field of interest 202. The location sensor 1204, in an instance, may be a GPS sensor configured to sense latitude and longitude coordinates of the motion sensor 1200. The orientation sensor 1202, in general, may be characterized as a sensor that senses the angle of an object relative to the ground and/or the magnetic field direction. The orientation sensor 1202, in an instance, may measure an azimuthal, a pitch and a roll angle of the motion sensor 1200. The azimuthal, in an instance, may be an angle between the longitudinal axis of the motion sensor 1200 and the Earth's magnetic field. The pitch, in an instance, may be an angle between the plane parallel to the ground and the plane of the motion sensor 1200. The roll, in an instance, may be an angle formed by tilting the motion sensor 1200 left or right.

Figure 13:
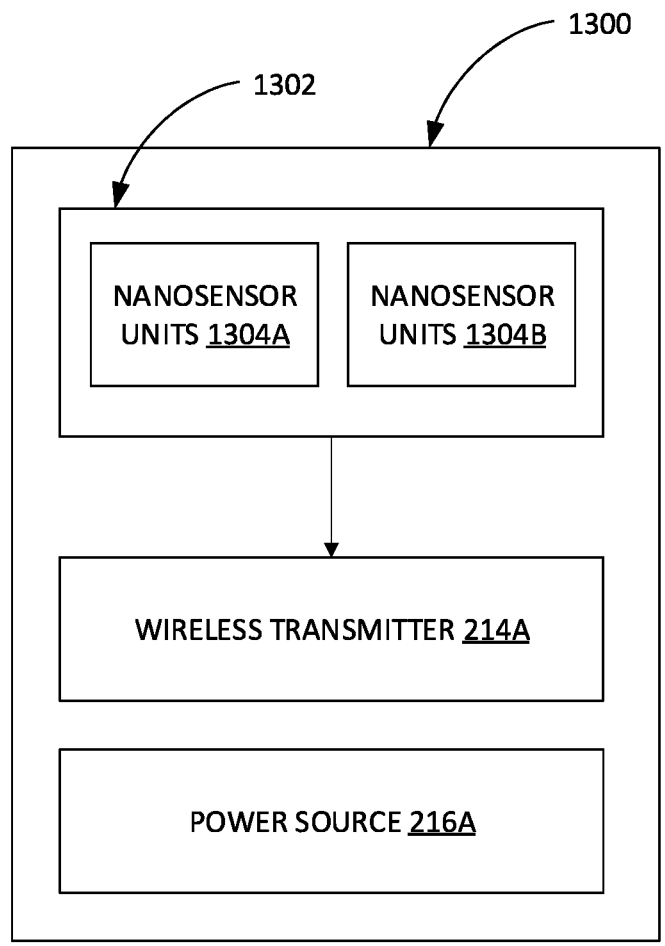
FIG. 13 illustrates a block diagram representation of a motion sensor including a photodetector array that may include a plurality of nanosensor units made of quantum dots, in accordance with some embodiments.

FIG. 13 illustrates a block diagram representation of a motion sensor 1300 including the photodetector array 1302 that may include a plurality of nanosensor units 1304 (such as nanosensor units 1304A and 1304B, as illustrated in FIG. 13) made of photodiode and/or quantum dot. Further, the quantum dot, in general, may be defined as a semiconductor crystal that may emit light of a specific frequency based on a size of the quantum dot. The quantum dot, in an instance, may be used as a photodetector in the motion sensor 1300 for photodetection. The photodetector based on quantum dots, in an instance, may accept the light of a broad frequency spectrum. The frequency spectrum, in an instance, may include, but not limited to, the visible frequency spectrum, near-infrared spectrum, mid-wave infrared spectrum. The photodetector, in an instance, may include stacks of tens of hybrid structure of InAs (indium arsenide) quantum dots and InGaAs (indium gallium arsenide) quantum well with AlInAs (aluminum indium arsenide) as a barrier. In an instance, for a surface of diameter equal to 25 micrometers, the photodetector may include 90,000 quantum dots. Further, the photodetector array 1302, in an instance, may have a responsivity of the range of 10 to 100 mA/W. The responsivity, in an instance, may reflect a gain of the photodetector array 1302 and may be defined as an output signal, typically voltage or current, of the photodetector array 1302 produced in response to a given incident radiant power falling on the photodetector array 1302. Further, the photodetector array 1302, in an instance, may have a quantum efficiency range up to 50%. The quantum dot, in an instance, may range in diameter from 2 nm to 50 nm.

Figure 14:
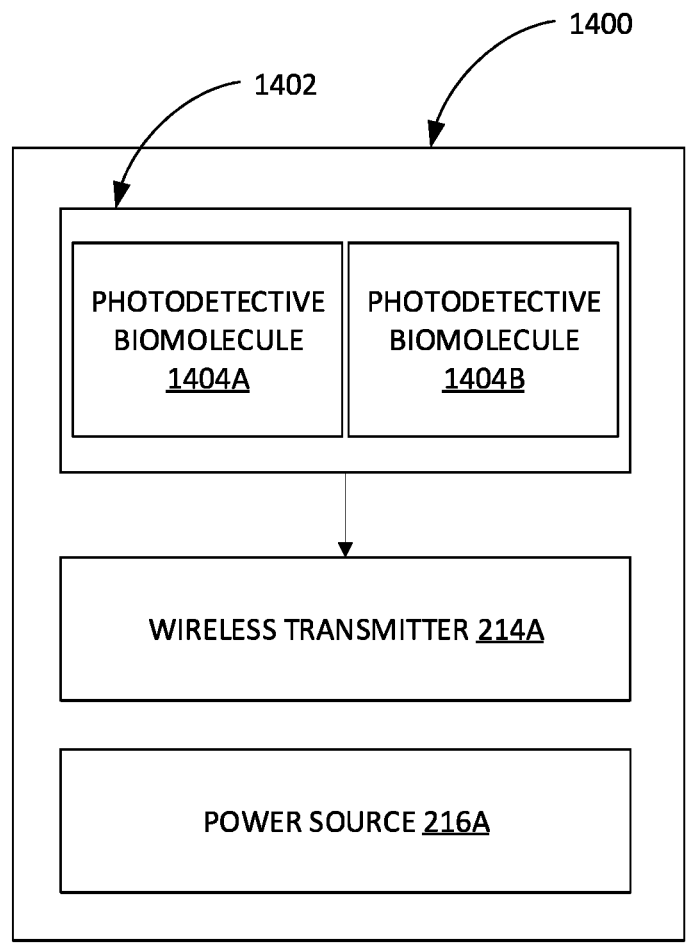
FIG. 14 illustrates a block diagram representation of a motion sensor including a photodetector array that may include a plurality of photodetective biomolecules, in accordance with some embodiments.

FIG. 14 illustrates a block diagram representation of a motion sensor 1400 including a photodetector array 1402 that may include a plurality of nanosensor units made up of a photodetective biomolecule 1404 and/or a polymer. Accordingly, in some embodiments, the photodetector array 1402 may include a plurality of photodetective biomolecules 1404 (such as photodetective biomolecule 1404A and 1404B, as illustrated in FIG. 14). Further, the quantum dot, in an instance, may be designed with the photodetective biomolecule 1404A. The photodetective biomolecule 1404A, in an instance, may be responsive to photons and/or may be able to convert the photon to a conducting electron.

Figure 15:
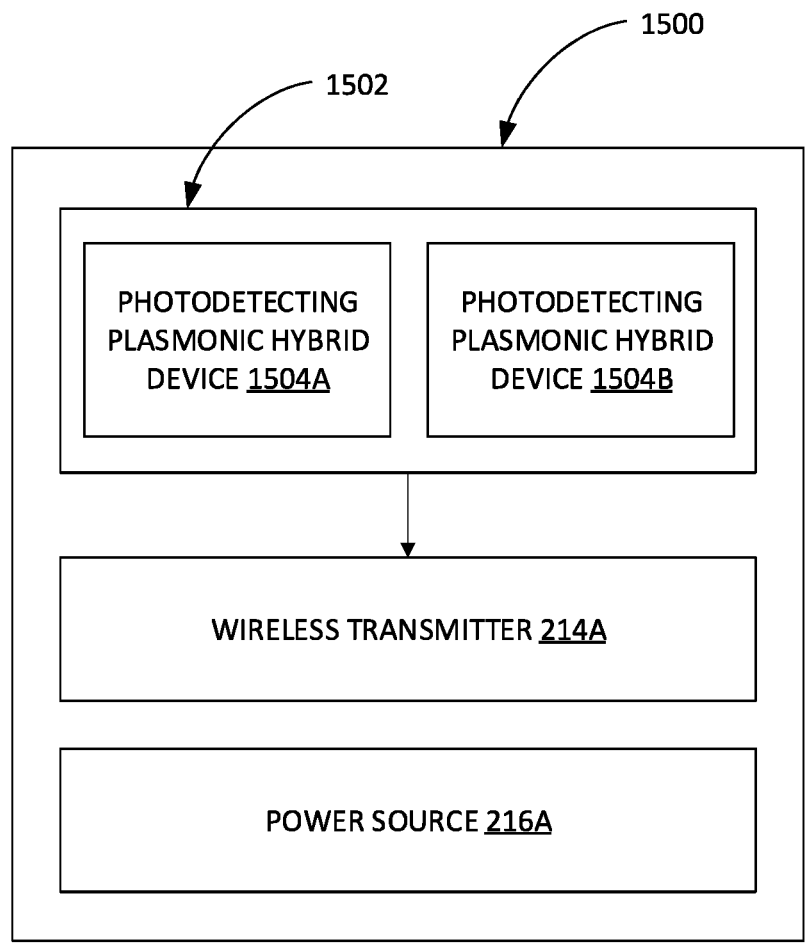
FIG. 15 illustrates a block diagram representation of a motion sensor including a photodetector array that may include a plurality of photodetecting plasmonic hybrid devices, in accordance with some embodiments.

FIG. 15 illustrates a block diagram representation of a motion sensor 1500 including a photodetector array 1502 that may include a plurality of nanosensor units made of photodetecting plasmonic hybrid devices 1504. Accordingly, in some embodiments, the photodetector array 1502 may include a plurality of photodetecting plasmonic hybrid devices 1504 (such as photodetecting plasmonic hybrid device 1504A and 1504B, as illustrated in FIG. 15). Further, the nanosensor unit, in an instance, may include, but not limited to, a nanoring (not shown in the figure), a surface plasmon (not shown in the figure). The surface plasmon, in an instance, may provide near-field enhancement and concentration of light into the photodetectors that may result in increased absorbance, responsivity and quantum efficiency. The nanoring, in an instance, may be a ring sized of an order of nanometers. The nanoring, in an instance, may be made up of materials such as, but not limited to, gold, or silver. The nanoring, in an instance, may achieve a significant field amplification by a factor of about 200 times in the near-field zone inside the nanoring. The field amplification, in an instance, may counter and/or compensate a decrease in the responsivity that results from a volume shrinkage of the photodetector size. The nanoring, in an instance, may house the photodetector to realize the photodetecting plasmonic hybrid device 1504A. A transmission power throughput (TPT), in an instance, may be expected to be of the order of 200% with the nanoring. The transmission power throughput (TPT) of light, in an instance, may be defined as a ratio of transmitted power to the incident power over a given aperture.

Figure 16:
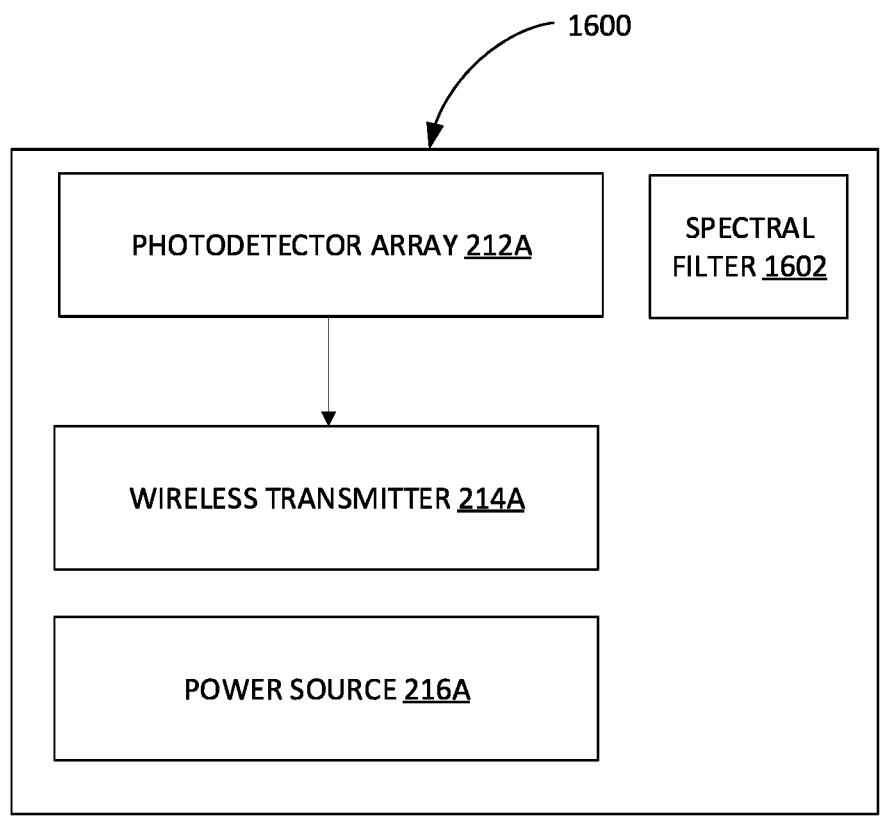
FIG. 16 illustrates a block diagram representation of a motion sensor including a spectral filter, in accordance with some embodiments.

FIG. 16 illustrates a block diagram representation of a motion sensor 1600 including a spectral filter 1602. Accordingly, in some embodiments, the motion sensor 1600 further may include the spectral filter 1602 configured to pass at least one predetermined band of frequencies onto the photodetector array 212A. The spectral filter 1602, in an instance, may be defined as a frequency filter that may allow or block a predetermined band of frequencies onto the photodetector array 212A. The band of frequencies, in an instance, may be optimized for different light wavelength detection. The band of frequencies, in an instance, may depend on a dielectric material used for the photodetector array 212A. The dielectric material, in general, may be characterized as an insulating material that may get polarized (form dipoles) in the presence of an electric field. The band of frequencies, in an instance, may also depend on a physical parameter of the nanoring. The physical parameter, in an instance, may include, but not limited to, a thickness of the nanoring, inner radius and/or outer radius of the nanoring etc. A decrease in the thickness of the nanoring, in an instance, may result in higher wavelength light detection.

Further, in some embodiment, the motion sensor 1600, in an instance, may include a plurality of photodetectors specific to well-determined spectral bands to detect changes of intensity whose displacements over the motion sensor 1600 network characterize motion and/or trajectories. Further, the spectral bands of interest, in an instance, may be the frequency bands that follow, but are not limited to, a visible light with wavelengths ranging from 300 nm to 750 nm for optical imaging and/or motion analysis, a near-infrared spectrum with wavelengths ranging from 750 nm to 3,000 nm for chemical imaging and/or motion analysis, a mid-infrared spectrum with wavelengths ranging from 3,000 nm to 15,000 nm for thermal imaging and/or motion analysis.

Figure 32:
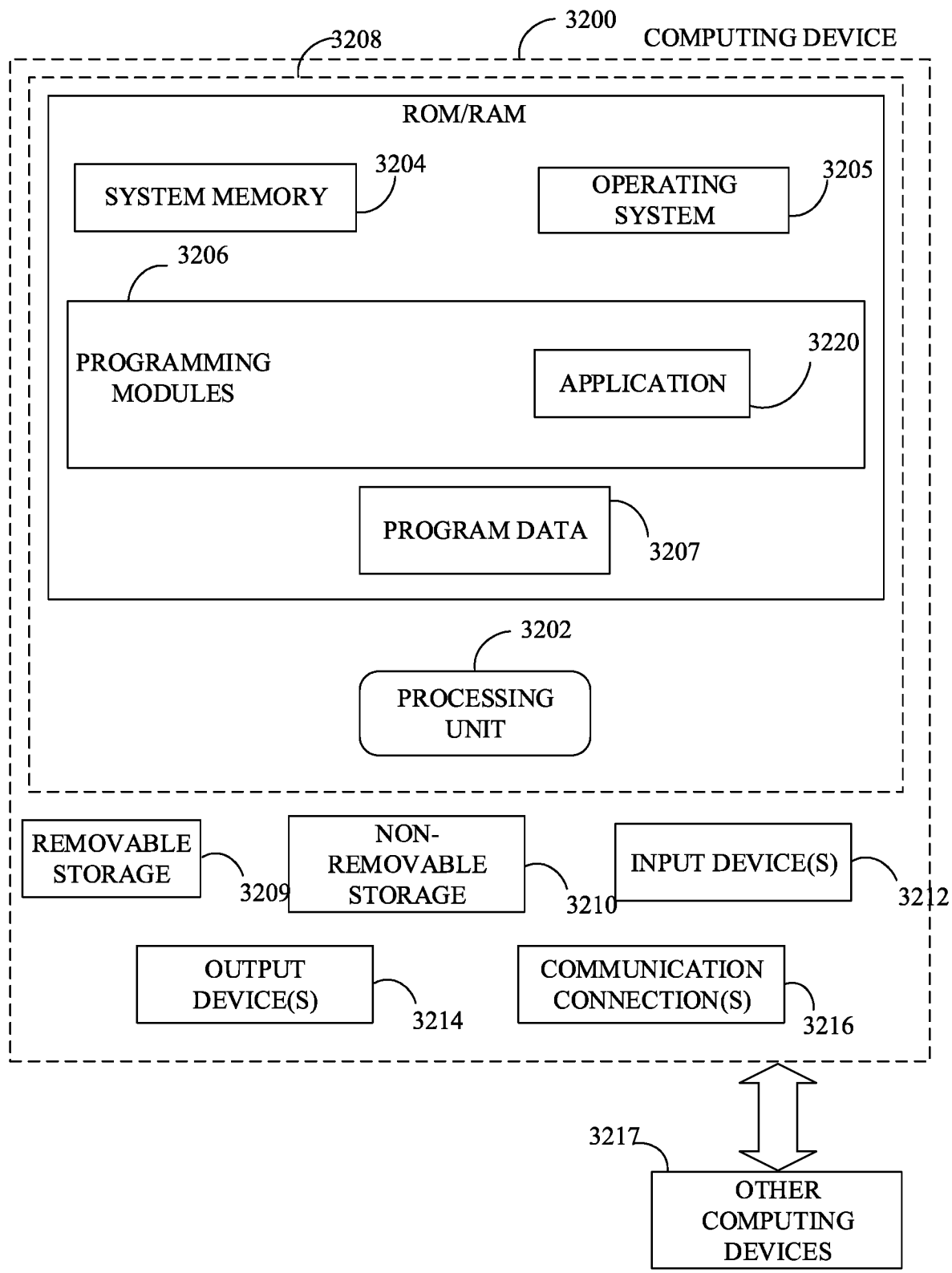
FIG. 32 is a block diagram of a computing device for implementing the methods disclosed herein, in accordance with some embodiments.

With reference to FIG. 32, a system consistent with an embodiment of the disclosure may include a computing device or cloud service, such as computing device 3200. In a basic configuration, computing device 3200 may include at least one processing unit 3202 and a system memory 3204. Depending on the configuration and type of computing device, system memory 3204 may comprise, but is not limited to, volatile (e.g. random-access memory (RAM)), non-volatile (e.g. read-only memory (ROM)), flash memory, or any combination. System memory 3204 may include operating system 3205, one or more programming modules 3206, and may include a program data 3207. Operating system 3205, for example, may be suitable for controlling computing device 3200's operation. In one embodiment, programming modules 3206 may include image-processing module, machine learning module and/or image classifying module. Furthermore, embodiments of the disclosure may be practiced in conjunction with a graphics library, other operating systems, or any other application program and is not limited to any particular application or system. This basic configuration is illustrated in FIG. 32 by those components within a dashed line 3208.

Computing device 3200 may have additional features or functionality. For example, computing device 3200 may also include additional data storage devices (removable and/or non-removable) such as, for example, magnetic disks, optical disks, or tape. Such additional storage is illustrated in FIG. 32 by a removable storage 3209 and a non-removable storage 3210. Computer storage media may include volatile and nonvolatile, removable and non-removable media implemented in any method or technology for storage of information, such as computer-readable instructions, data structures, program modules, or other data. System memory 3204, removable storage 3209, and non-removable storage 3210 are all computer storage media examples (i.e., memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 3200. Any such computer storage media may be part of device 3200. Computing device 3200 may also have input device(s) 3212 such as a keyboard, a mouse, a pen, a sound input device, a touch input device, a location sensor, a camera, a biometric sensor, etc. Output device(s) 3214 such as a display, speakers, a printer, etc. may also be included. The aforementioned devices are examples and others may be used.

Computing device 3200 may also contain a communication connection 3216 that may allow device 3200 to communicate with other computing devices 3218, such as over a network in a distributed computing environment, for example, an intranet or the Internet. Communication connection 3216 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both storage media and communication media.

As stated above, a number of program modules and data files may be stored in system memory 3204, including operating system 3205. While executing on processing unit 3202, programming modules 3206 (e.g., application 3220 such as a media player) may perform processes including, for example, one or more stages of methods, algorithms, systems, applications, servers, databases as described above. The aforementioned process is an example, and processing unit 3202 may perform other processes. Other programming modules that may be used in accordance with embodiments of the present disclosure may include sound encoding/decoding applications, machine learning application, acoustic classifiers etc.

Generally, consistent with embodiments of the disclosure, program modules may include routines, programs, components, data structures, and other types of structures that may perform particular tasks or that may implement particular abstract data types. Moreover, embodiments of the disclosure may be practiced with other computer system configurations, including hand-held devices, general purpose graphics processor-based systems, multiprocessor systems, microprocessor-based or programmable consumer electronics, application specific integrated circuit-based electronics, minicomputers, mainframe computers, and the like. Embodiments of the disclosure may also be practiced in distributed computing environments where tasks are performed by remote processing devices that are linked through a communications network. In a distributed computing environment, program modules may be located in both local and remote memory storage devices.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general-purpose computer or in any other circuits or systems.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random-access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, solid state storage (e.g., USB drive), or a CD-ROM, a carrier wave from the Internet, or other forms of RAM or ROM. Further, the disclosed methods' stages may be modified in any manner, including by reordering stages and/or inserting or deleting stages, without departing from the disclosure.

Although the invention has been explained in relation to its preferred embodiment, it is to be understood that many other possible modifications and variations can be made without departing from the spirit and scope of the invention.

The invention claimed is:

1. A system that performs motion analysis in a field of interest, wherein the system comprises:
   at least one gateway disposed proximal to the field of interest, wherein the at least one gateway is a two-way interface communicating with a remote monitoring center and a plurality of motion sensors;
   the plurality of motion sensors disposed as a network in the field of interest, wherein each of the plurality of motion sensors comprises:
      a photodetector array performing photodetection and generating digital information representing a sample;
      a processor communicatively coupled to the photodetector array;
      a wireless transmitter communicatively coupled to the processor, wherein the wireless transmitter transmits the digital information to at least one of a motion sensor of the plurality of motion sensors and the at least one gateway; and
      a power source providing electrical energy to the processor and the wireless transmitter;
   a plurality of video cameras disposed at a plurality of key locations in the field of interest, wherein each of the plurality of video cameras captures image sequences associated with a portion of the field of interest, wherein at least one of the plurality of video camera transmits a part of a corresponding image sequence to the remote monitoring center through the at least one gateway;
   a plurality of detectors;
   the plurality of detectors disposed in the field of interest;
   each of the plurality of detectors detecting a microwave energy, speed, a metal, acoustic energy, displacement, velocity, a dangerous radioactive energy, a chemical and a mineral;
   wherein the plurality of motion sensors are disposed on an entirety of an infrastructure;
   wherein each of the plurality of motion sensors comprises an individual adhesive layer adhering to a portion of the infrastructure, wherein each of the plurality of motion sensors is characterized by at least one of a semilunar shape adhering on a surface and an oblong spherical shape not adhering on any surface in the field of interest;
   wherein each of the plurality of motion sensors comprises a spectral filter passing at least one predetermined band of frequencies onto the photodetector array.

2. The system of claim 1, wherein the motion sensors further comprises a clock configured to generate a periodic signal, wherein the clock is communicatively coupled to the processor, wherein, the processor is configured to sequence sampling of photodetector measurements and to generate the timestamps at a rate based on the periodic signal.

3. The system of claim 1, wherein the motion sensor further comprises a memory communicatively coupled to the processor, wherein the memory is configured as a buffer to temporarily store the digital information and control information received from the remote monitoring center, wherein the control information comprises an identification number, a photodetection intensity threshold to trigger reaction, a sampling period, a maximal period before transmitting updates and photodetector summation patterns, wherein the processor is further configured to process the digital information and the control information, to generate timestamps, to trigger the photodetection sampling and the wireless communications.

4. The system of claim 1 further comprising the remote monitoring center, wherein the remote monitoring center further comprises:
   a communication device configured to communicate with the at least one gateway and the plurality of video cameras, wherein the plurality of video cameras is located on at least one of a robot and a drone;
   a processing device based on artificial intelligence configured to perform motion analysis and moving pattern recognition in real time based on the digital information and the image sequences; and
   a big data storage device configured to store the digital information and results of the motion analysis and moving pattern recognition.

5. The system of claim 1, wherein the at least one gateway comprises at least one of at least one drone capable of flight over the field of interest and at least one robot capable of movement in the field of interest.

6. The system of claim 5 further comprising a location sensor configured to determine a geographical location of at least one of the at least one drone and the at least one robot, wherein at least one of the at least one drone and the at least one robot is configured to transmit the geographical location to the remote monitoring station.

7. The system of claim 5, wherein at least one of the at least one drone and the at least one robot further comprises a housing configured to accommodate at least one of the plurality of motion sensors and at least one video camera of the plurality of video cameras.

8. The system of claim 7, wherein the at least one of the at least one drone and the at least one robot is configured to simultaneously dispose the plurality of motion sensors in the field of interest.

9. The system of claim 1, wherein the motion sensor comprises an anterior surface and a posterior surface, wherein the photodetector array comprises a plurality of photodetector units disposed over the anterior surface, wherein the anterior surface forms at least one of a convex shape and a planar shape, wherein the posterior surface is configured to be attached to a portion of at least one of an infrastructure and a common supporting frame.

10. The system of claim 9, wherein the motion sensor comprises a plurality of microlenses corresponding to the plurality of photodetector units, wherein a microlens corresponding to a photodetector unit is configured to funnel the light emanating from a portion of the field of interest onto the photodetector unit, wherein the portion of the field of interest is designed as a limited angle of view determining a cone of visibility.

11. The system of claim 1, wherein the plurality of photodetectors in the array is configured to perform at least one of an increase in optical sensitivity and an increase in radiance detection based on at least one factor selected from the group comprising:
   an area of an optical microlens;
   a field of view of the optical microlens;
   an integration time between two consecutive sampling times; and
   a spatial summation obtained by clustering neighboring photodetectors.

12. The system of claim 2, wherein a photodetector in the photodetectors array is configured to deliver, at the sampling time triggered by the processor, a digital number based on the number of photons captured during the period of time starting at the previous sampling time.

13. The system of claim 1, wherein the processor is configured to:
- detect a change of radiant intensity in a field of view of each photodetector in the photodetector array by sampling the photodetector array and collecting a plurality of samples with a given rate determined based on at least one of a local intensity of ambient light and a request received from the remote monitoring center; and
- perform a spatial summation of the plurality of samples generated by at least two of a plurality of photodetector units of the photodetector array, wherein a number and a pattern associated with the spatial summation is determined based on at least one of a local intensity of ambient light and a request received from the remote monitoring center.

14. The system of claim 1, wherein the processor is configured to send a message to the remote monitoring center based on at least one of a change of contrast and detection of an incoming radiant intensity in one or more photodetector units of the photodetector array, wherein the photodetector array is configured to generate at least one sample in accordance with a sampling frequency, wherein a threshold for detecting the change of contrast is determined based on at least one of a local intensity of ambient light and a request received from the remote monitoring center, wherein the message is composed at least of the at least one sample, at least one time stamp and at least one motion sensor identifier corresponding to the at least one sample.

15. The system of claim 1, wherein the motion sensor further comprises a spatial sensor configured to sense at least one of an orientation and a location, wherein the orientation comprises a stereoscopic vector orthogonal to a plane of the photodetector array, wherein the location comprises the coordinates of the motion sensor in relation to the field of interest.

16. The system of claim 1, wherein the photodetector array comprises a plurality of nanosensor units made of at least one of photodiode and quantum dot.

17. The system of claim 1, wherein the photodetector array comprises a plurality of nanosensor units made of at least one of a photodetecting biomolecule and a photodetecting polymer.

18. The system of claim 1, wherein the photodetector array comprises a plurality of nanosensor units made of a photodetecting plasmonic hybrid device.

19. The system of claim 1, wherein the motion sensors further comprise a plurality of photodetectors specific to predetermined spectral bands and configured to detect a change in intensity, wherein a displacement of the change in intensity across the plurality of motion sensors characterizes at least one of a motion and a trajectory.

* * * * *